(12) United States Patent
Fukumori

(10) Patent No.: US 10,306,757 B2
(45) Date of Patent: May 28, 2019

(54) CIRCUIT BOARD AND ELECTRONIC DEVICE

(71) Applicant: FUJITSU LIMITED, Kawasaki-shi, Kanagawa (JP)

(72) Inventor: Taiga Fukumori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/986,553

(22) Filed: May 22, 2018

(65) Prior Publication Data

US 2018/0270949 A1 Sep. 20, 2018

Related U.S. Application Data

(63) Continuation of application No. PCT/JP2015/083402, filed on Nov. 27, 2015.

(51) Int. Cl.
*H01P 3/08* (2006.01)
*H05K 1/03* (2006.01)
(Continued)

(52) U.S. Cl.
CPC ............ *H05K 1/0366* (2013.01); *H01P 3/08* (2013.01); *H05K 1/02* (2013.01); *H05K 1/0225* (2013.01);
(Continued)

(58) Field of Classification Search
USPC .................................................. 361/748, 760
See application file for complete search history.

(56) References Cited

U.S. PATENT DOCUMENTS

2004/0130877 A1 7/2004 Okubora
2008/0029299 A1 2/2008 Hakamada
(Continued)

FOREIGN PATENT DOCUMENTS

EP 2 574 155 A1 3/2013
JP 62-9697 A 1/1987
(Continued)

OTHER PUBLICATIONS

International Search Report issued in International Application No. PCT/JP2015/083402 dated Feb. 16, 2016 (three pages) with English-language translation (one page).
(Continued)

*Primary Examiner* — Andargie M Aychillhum
(74) *Attorney, Agent, or Firm* — Kratz, Quintos & Hanson, LLP

(57) ABSTRACT

A circuit board includes an insulation layer, a signal line formed over the insulation layer and extending in a direction X, and a conductor layer formed under the insulation layer. The insulation layer has periodic dielectric-constant distribution in a direction Y orthogonal to the direction X. The conductor layer includes a slit at a position corresponding to the signal line. The slit expands an electric field produced between the signal line and the conductor layer; causes less difference in dielectric constants of the insulation layer in the vicinity of the signal line (the difference is caused by the positional relationship between the signal line and the dielectric-constant distribution of the insulation layer); and reduces difference in signal transmission speeds caused by the positional relationship.

17 Claims, 20 Drawing Sheets

(51) Int. Cl.
*H05K 1/02* (2006.01)
*H05K 1/11* (2006.01)
*H05K 1/18* (2006.01)

(52) U.S. Cl.
CPC .............. *H05K 1/113* (2013.01); *H05K 1/181* (2013.01); *H05K 2201/0187* (2013.01); *H05K 2201/0191* (2013.01); *H05K 2201/0195* (2013.01); *H05K 2201/029* (2013.01); *H05K 2201/0715* (2013.01); *H05K 2201/0723* (2013.01); *H05K 2201/10378* (2013.01); *H05K 2201/10734* (2013.01)

(56) References Cited

U.S. PATENT DOCUMENTS

| | | |
|---|---|---|
| 2011/0078895 A1 | 4/2011 | Suwada |
| 2012/0097428 A1 | 4/2012 | Kato et al. |
| 2012/0274423 A1 | 11/2012 | Kato |

FOREIGN PATENT DOCUMENTS

| | | | |
|---|---|---|---|
| JP | 2003-218271 A | 7/2003 | |
| JP | 2004-140308 A | 5/2004 | |
| JP | 2006-157646 A | 6/2006 | |
| JP | 2007-294563 A | 8/2007 | |
| JP | 2007-294563 A | 11/2007 | |
| JP | 2008-041454 A | 2/2008 | |
| JP | 2009-124044 A | 6/2009 | |
| JP | 2011-082271 A | 4/2011 | |
| JP | 2012-089903 A | 5/2012 | |
| JP | 2012-138471 A | 7/2012 | |
| JP | 2012-253342 A | 12/2012 | |
| JP | 2014-130860 * | 7/2014 | .............. H05K 3/46 |
| JP | 2014-130860 A | 7/2014 | |
| JP | 2014-179535 A | 9/2014 | |
| WO | 2012/073591 A1 | 6/2012 | |

OTHER PUBLICATIONS

Office Action of Japanese Patent Application No. 2017-552635 dated Nov. 27, 2018 (4 pages, 3 pages translation).

* cited by examiner

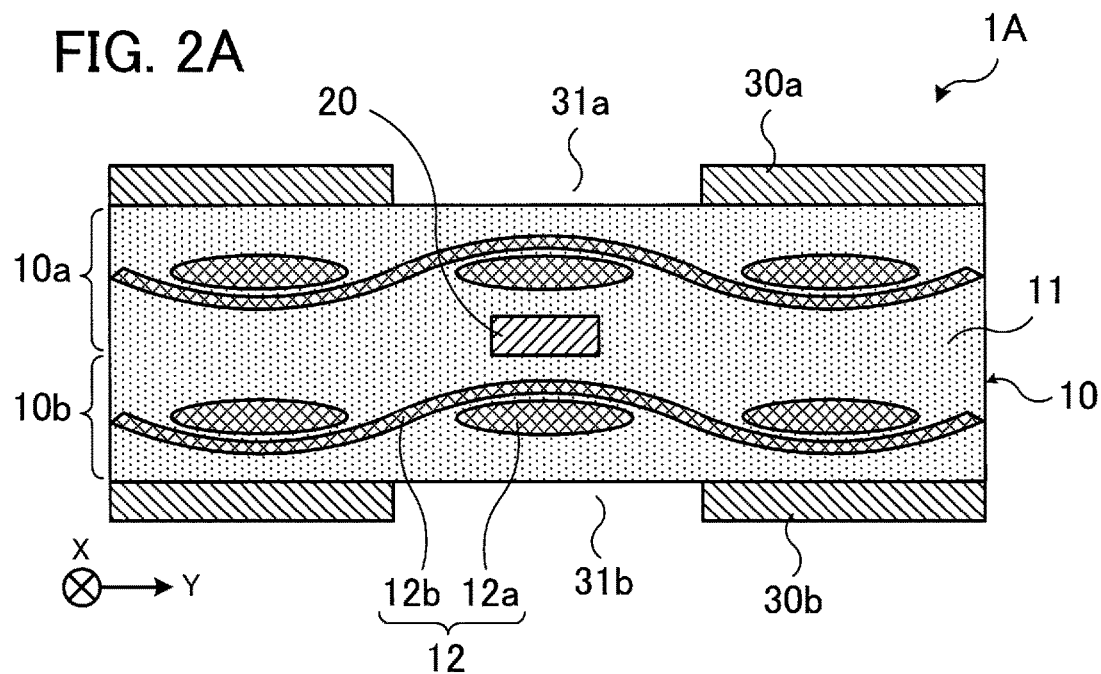
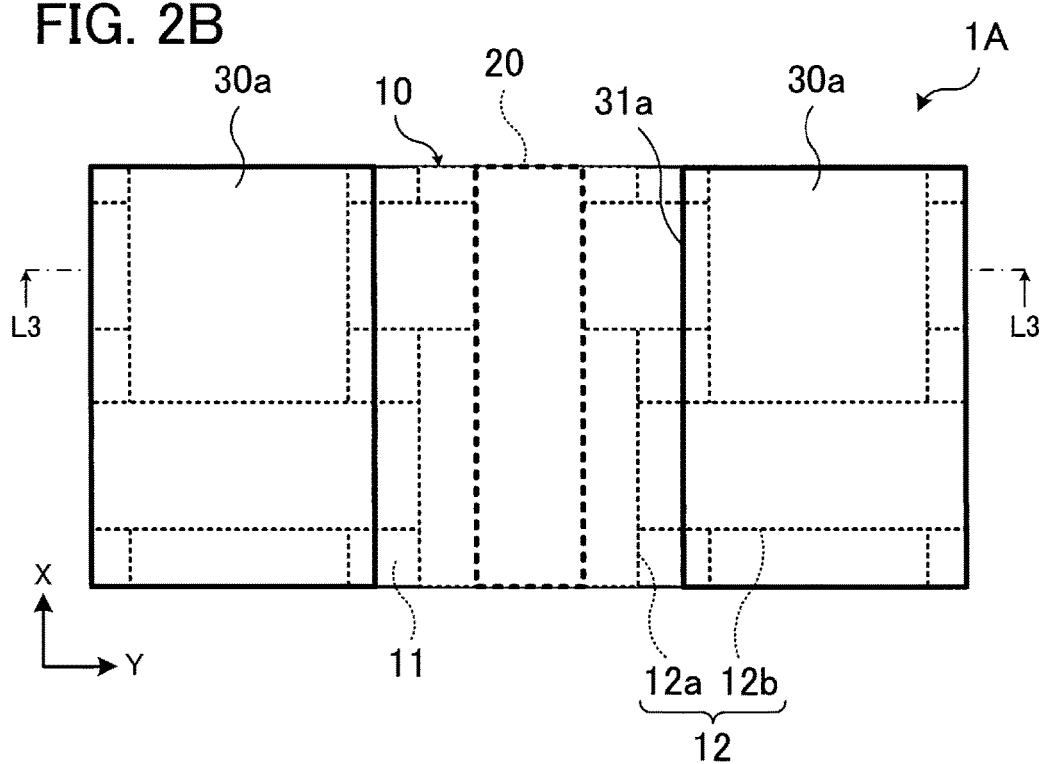

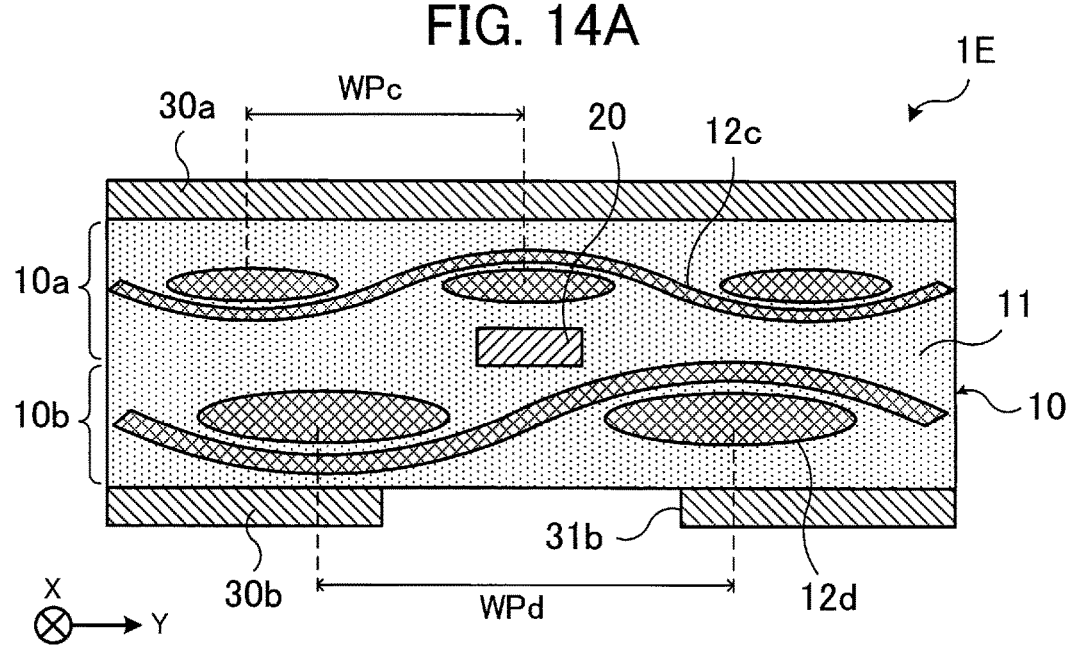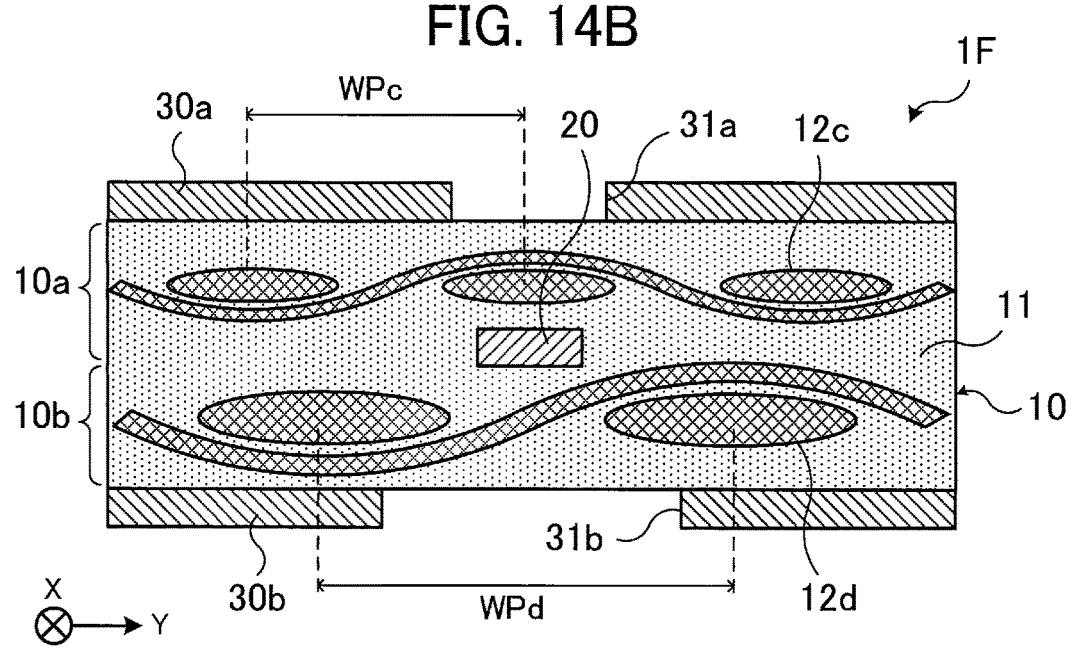

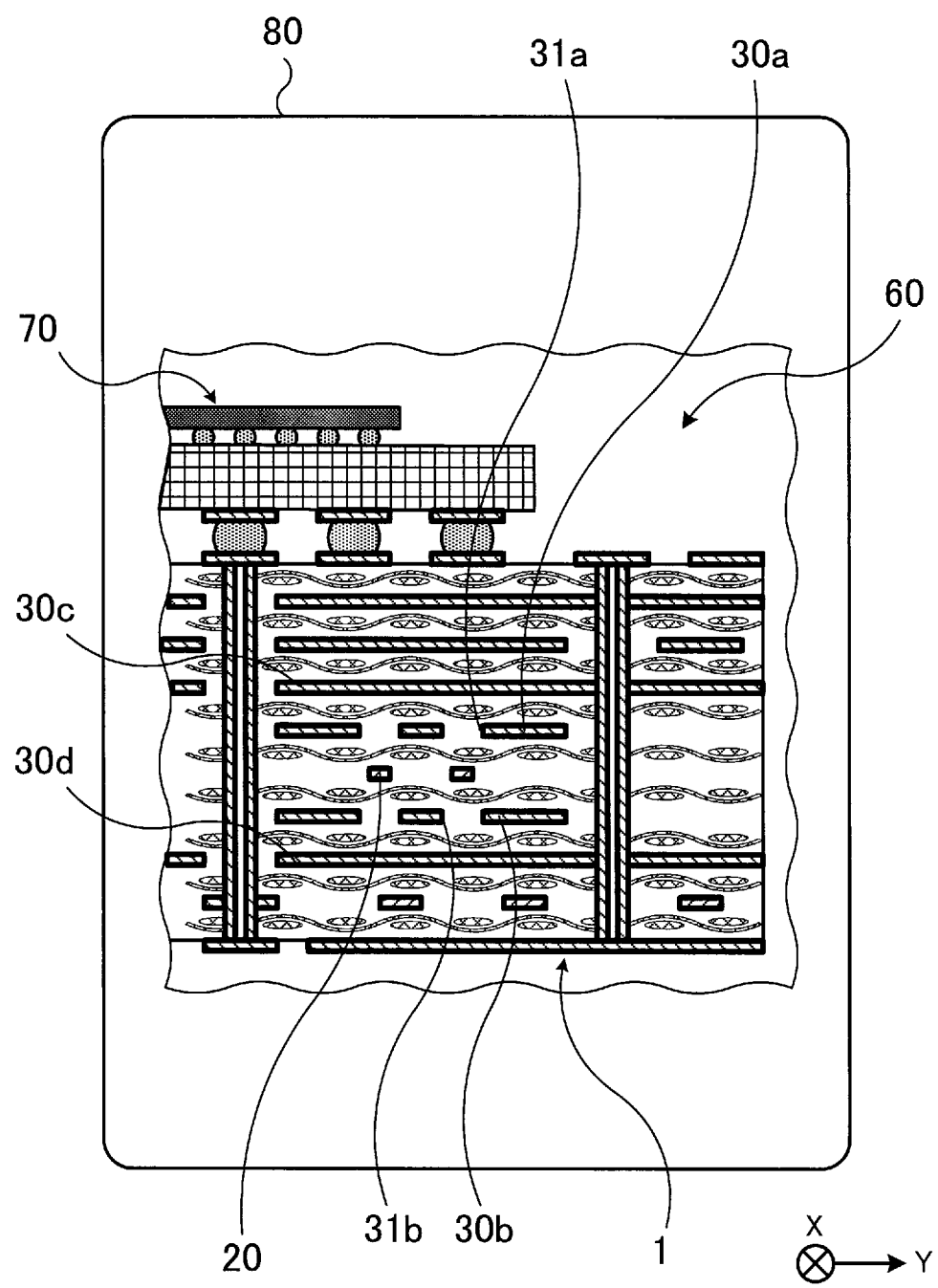

US 10,306,757 B2

CIRCUIT BOARD AND ELECTRONIC DEVICE

CROSS-REFERENCE TO RELATED APPLICATION

This application is a continuation application of International Application PCT/JP2015/083402 filed on Nov. 27, 2015 which designated the U.S., the entire contents of which are incorporated herein by reference.

FIELD

The embodiments discussed herein are related to a circuit board and an electronic device.

BACKGROUND

For an insulation layer of a circuit board, a known technique uses a material in which a cloth is contained in resin. The cloth is made of glass fiber, for example. Such a material insulates conductors, such as lines formed in the circuit board, from each other; and gives the circuit board a sufficient stiffness.

Some circuit boards have a stripline structure in which conductor layers are formed above and below a signal line for signal transmission, via insulation layers. Other circuit boards have a microstripline structure in which a signal line is formed over an insulation layer and a conductor layer is formed under the insulation layer.

See, for example, Japanese Laid-open Patent Publication No. 2014-130860.

In the circuit boards that have the stripline structure or the microstripline structure, dielectric constant of an insulation layer may affect the signal transmission speed of the signal line.

In a circuit board in which a material containing a glass cloth or the like is used for an insulation layer, for example, dielectric-constant distribution periodic due to a yarn pattern or a weave pattern of the cloth may occur in the insulation layer. In such a circuit board having the dielectric-constant distribution of the insulation layer, difference (variations) in signal transmission speed of signal lines may occur, depending on the positional relationship between the signal lines and the dielectric-constant distribution. Such a positional relationship is difficult to control in the manufacturing of the circuit board.

When the difference in signal transmission speed of the signal lines of the circuit board occurs, difference in signal arrival time to a certain circuit may occur in an electronic device which uses the circuit board. This may cause the electronic device to fail to carry out a desired operation.

SUMMARY

According to one aspect, there is provided a circuit board which includes: a first insulation layer; a signal line formed over the first insulation layer and extending in a first direction; and a first conductor layer formed under the first insulation layer, wherein the first insulation layer has periodic dielectric-constant distribution in a second direction orthogonal to the first direction, and wherein the first conductor layer includes a first opening at a position corresponding to the signal line.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWING

FIGS. 2A and 2B illustrate one example of a circuit board of a first embodiment;

FIGS. 14A and 14B illustrate examples of a circuit board of a fifth embodiment;

FIG. 20 illustrates one example of an electronic apparatus.

DESCRIPTION OF EMBODIMENTS

First, one embodiment of a circuit board will be described.

Figure 1A:
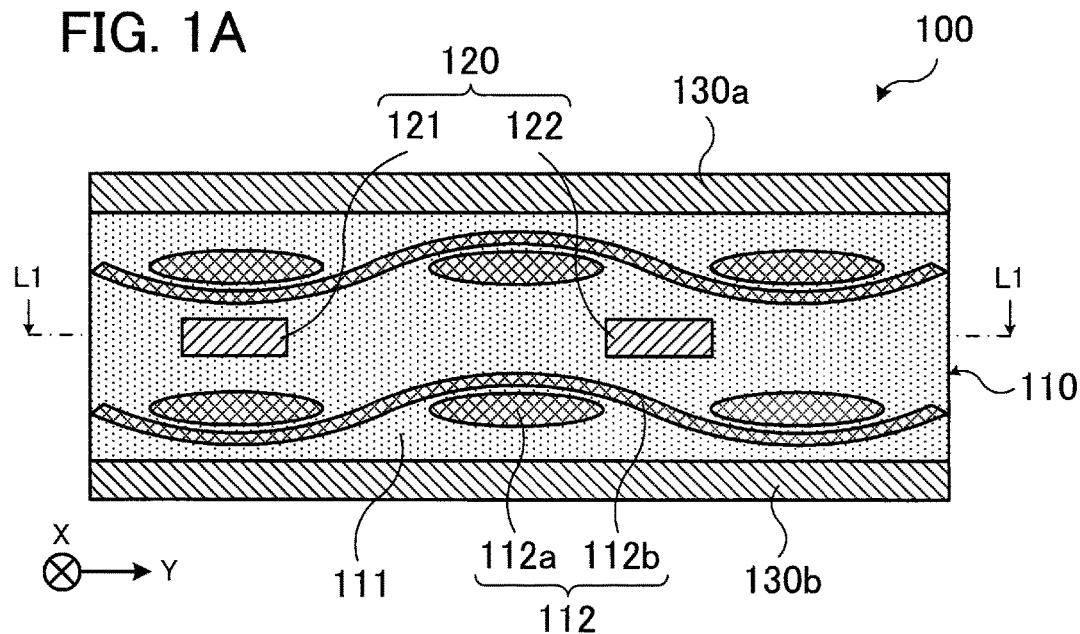
FIGS. 1A and 1B illustrate a circuit board of one embodiment.
Figure 1B:
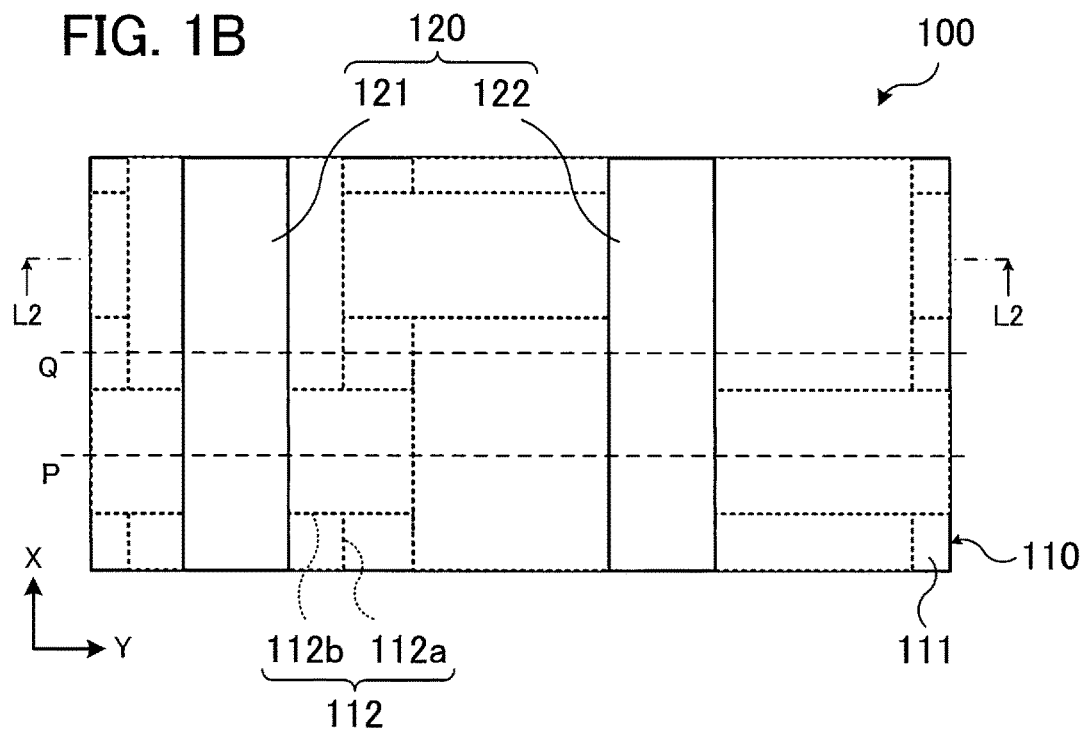

FIGS. 1A and 1B illustrate a circuit board of one embodiment. FIG. 1A schematically illustrates a cross section of a principal part of the circuit board of one embodiment. FIG. 1B schematically illustrates a plane of the principal part of the circuit board of one embodiment. Specifically, FIG. 1A schematically illustrates the cross section taken along a line L2-L2 of FIG. 1B; FIG. 1B schematically illustrates the plane taken along a line L1-L1 of FIG. 1A.

A circuit board 100 illustrated in FIGS. 1A and 1B includes an insulation layer 110, signal wiring (lines) 120 formed in the insulation layer 110, a conductor layer 130a formed over the insulation layer 110, and a conductor layer 130b formed under the insulation layer 110.

The insulation layer 110 includes a composite material made by impregnating a glass cloth 112 with a resin 111. The glass cloth 112 is made by, for example, plain-weaving a warp yarn 112a and a weft yarn 112b. The warp yarn 112a and the weft yarn 112b are made of glass.

The signal wiring 120, which is formed in the insulation layer 110 made of such a material, includes, as an example, a signal line 121 and a signal line 122 extending in a direction X as illustrated in FIGS. 1A and 1B. For example, high-frequency signals are transmitted along the signal lines 121 and 122.

The conductor layers 130a and 130b are respectively formed over and under the insulation layer 110, and have a size to cover the signal wiring 120 (the signal lines 121 and 122). For example, the conductor layers 130a and 130b have the ground potential.

Thus, the circuit board 100 has a stripline structure in which the conductor layers 130a and 130b are formed over and under the signal wiring 120 via the insulation layer 110. For example, when high-speed signals with a speed exceeding 1 Gbps are used, such a stripline structure is widely used. In the stripline structure, the conductor layers 130a and 130b suppress electromagnetic interference between signals transmitted along the signal wiring 120 and signals transmitted along other signal lines.

In the circuit board 100, the glass cloth 112 impregnated with the resin 111 is used as a material of the insulation layer 110. Thus, the material gives a sufficient stiffness to the insulation layer 110 and the circuit board 100 that uses the insulation layer 110.

In the insulation layer 110 of the circuit board 100, the periodic dielectric-constant distribution occurs due to a yarn pattern or a weave pattern of the glass cloth 112 in the resin 111. Now, pay attention to the dielectric-constant distribution in a direction Y orthogonal to the direction X, in which the signal wiring 120 extends. In the direction Y, the periodic dielectric-constant distribution occurs, for example, in an area taken along a chain line P of FIG. 1B. The periodic dielectric-constant distribution is caused by alternate arrangements of a portion where only the weft yarn 112b exists and a portion where the weft yarn 112b and the warp yarn 112a overlap with each other. In the direction Y, the periodic dielectric-constant distribution also occurs, for example, in an area taken along a chain line Q of FIG. 1B. The periodic dielectric-constant distribution is caused by alternate arrangements of a portion where the warp yarn 112a exists and a portion where the warp yarn 112a does not exist.

FIGS. 1A and 1B illustrate signal lines 121 and 122, which serve as the signal wiring 120. The signal lines 121 and 122 are positioned as illustrated in FIGS. 1A and 1B, and formed in the insulation layer 110 having such periodic dielectric-constant distribution. The signal line 121, which serves as the signal wiring 120, is formed directly above or below a corresponding warp yarn 112a, which extends in the direction X. The signal line 122, which also serves as the signal wiring 120, is formed directly above or below a portion between two adjacent warp yarns 112a.

For example, in the cross section illustrated in FIG. 1A (cross section taken along the line L2-L2 or the chain line P of FIG. 1B), there is a structure of the warp yarn 112a and the weft yarn 112b overlapping with each other in the resin 111 between the signal line 121 and the conductor layer 130a or 130b. Between the signal line 122 and the conductor layer 130a or 130b, in contrast, only the weft yarn 112b exists in the resin 111. In another cross section (cross section taken along the chain line Q of FIG. 1B), the warp yarn 112a exists between the signal line 121 and the conductor layer 130a or 130b, but does not exist between the signal line 122 and the conductor layer 130a or 130b.

The signal line 121 is closer to the glass cloth 112 than the signal line 122, and the volume of the glass cloth 112 positioned between the signal line 121 and the conductor layer 130a or 130b is larger than the volume of the glass cloth 112 positioned between the signal line 122 and the conductor layer 130a or 130b. As a result, the dielectric constant of the insulation layer 110 in the vicinity of the signal line 121 becomes higher than the dielectric constant of the insulation layer 110 in the vicinity of the signal line 122.

The dielectric constant of the insulation layer 110 in the vicinity of the signal wiring 120 affects the transmission speed of signals transmitted along the signal wiring 120. The signal transmission speed of the signal line 121, which is positioned in the insulation layer 110 having a relatively high dielectric constant, tends to be slower than the signal transmission speed of the signal line 122, which is positioned in the insulation layer 110 having a relatively low dielectric constant.

Thus, the signal wiring 120 has difference in the signal transmission speed, depending on where the signal wiring 120 is positioned with respect to the yarn pattern or the weave pattern of the glass cloth 112, that is, depending on the positional relationship between the signal wiring 120 and the dielectric-constant distribution of the insulation layer 110, which occurs due to the use of the glass cloth 112. The difference in the signal transmission speed causes difference (variations, skew) in arrival time or propagation delay time of a signal to a certain circuit. In general, the difference in propagation delay time could be up to 1 to 5%, depending on a material or wiring that is used.

This problem becomes more serious as the transmission signals are transmitted faster (as the time intervals of the transmission signals are shorter). For example, in a case where signals are transmitted along a line having a length of 10 cm, the transmission time is about 700 picoseconds (ps). If the error is 1%, the difference in transmission times is 7 ps. For example, when signals are transmitted at 20 Gbps, the interval between adjacent signals is 50 ps. In this case, if an error about 10% is permitted by improving a transmission and reception circuit, for example, that means the difference of 5 ps would be permitted. Thus, when signals are transmitted at 20 Gbps or more, the permissible difference in transmission time is 5 ps or less. Therefore, the above-described difference 7 ps in transmission time is not permissible.

The positional relationship between the signal wiring 120 and the dielectric-constant distribution of the insulation layer 110, in which the glass cloth 112 is used, is difficult to control in the manufacturing. That is, whether the signal wiring 120 is positioned directly above or below the warp yarn 112a as in the case of the signal line 121, or whether the signal wiring 120 is positioned directly above or below the portion between adjacent warp yarns 112a as in the case of the signal line 122, are not determined until the circuit board is actually manufactured. In the vicinity of the portion between adjacent warp yarns 112a, the dielectric constant is relatively low, so that the delay in signal transmission speed is more suppressed. However, arranging the signal wiring 120 directly above or below the portion between adjacent warp yarns 112a is difficult for the above reason.

Here, if the width of the signal wiring 120 is in a range of 75 to 95% of the glass yarn pitch (arrangement interval) of the glass cloth 112, the difference in signal transmission speed may be reduced, regardless of the positional relationship between the signal wiring 120 and the glass cloth 112. However, the width of the signal wiring 120 will depend on the glass yarn pitch of the glass cloth 112, which is used for the insulation layer 110.

In view of the above-described points, techniques described below as embodiments are used to suppress the variations or skew in the signal transmission speed, which is caused by the positional relationship between the signal line of the circuit board and the dielectric-constant distribution of the insulation layer.

First, a first embodiment will be described.

FIGS. 2A and 2B illustrate one example of a circuit board of the first embodiment. FIG. 2A schematically illustrates a cross section of a principal part of one example of the circuit board of the first embodiment. FIG. 2B schematically illustrates a plane of the principal part of one example of the circuit board of the first embodiment. Specifically, FIG. 2A schematically illustrates the cross section taken along a line L3-L3 of FIG. 2B.

A circuit board 1A illustrated in FIGS. 2A and 2B includes an insulation layer 10, a signal line 20 formed in the insulation layer 10, a conductor layer 30a formed over the insulation layer 10, and a conductor layer 30b formed under the insulation layer 10.

The insulation layer 10 is made of a composite material made by impregnating a glass cloth 12 with a resin 11, such as epoxy resin. The glass cloth 12 is made of glass yarn, which is used as a warp yarn 12a and a weft yarn 12b.

The resin 11 may be any of various resins, such as epoxy resin. The resin 11 may also be polyimide resin, bismaleimide triazine resin, or phenol resin.

The glass cloth 12 impregnated with the resin 11, which is used as a material of the insulation layer 10, gives a sufficient stiffness to the insulation layer 10 and the circuit board 1A which uses the insulation layer 10. In the insulation layer 10 in which the glass cloth 12 is used, periodic dielectric-constant distribution occurs due to a yarn pattern or a weave pattern of the glass cloth 12 in the resin 11. In the insulation layer 10 having such dielectric-constant distribution, a signal line 20 extending in a direction X is formed as illustrated in FIGS. 2A and 2B.

The signal line 20 may be made of any of various conductive materials. For example, the signal line 20 may be made of copper (Cu) or a material containing copper. The signal line 20 may also be made of aluminum (Al) or a material containing aluminum.

Although FIGS. 2A and 2B illustrate the signal line 20 which is directly above or below the warp yarn 12a extending in the direction X, the position of the signal line 20 is not limited to this example, in the circuit board 1A of the first embodiment. The position of the signal line 20 extending in the direction X is not restricted by the dielectric-constant distribution of the insulation layer 10, distributed in a direction Y which is orthogonal to the direction X. For example, the signal line 20 may be directly above or below the warp yarn 12a extending in the direction X, as illustrated in FIGS. 2A and 2B; or may be directly above or below a portion between two adjacent warp yarns 12a.

The conductor layer 30a formed over the insulation layer 10 and the conductor layer 30b formed under the insulation layer 10 may be made of any of various conductive materials. For example, the conductor layers 30a and 30b may be made of copper or a material containing copper. The conductor layers 30a and 30b may be made of aluminum or a material containing aluminum.

The conductor layer 30a formed over the insulation layer 10 is provided with a slit (opening) 31a at a position corresponding to the signal line 20, which extends in the direction X. Similarly, the conductor layer 30b formed under the insulation layer 10 is provided with a slit (opening) 31b at a position corresponding to the signal line 20, which extends in the direction X. The slits 31a and 31b have a planar shape formed along the signal line 20, which extends in the direction X. For example, the planar shape is similar to or the same as the planar shape of the signal line 20, which extends in the direction X.

In the circuit board 1A, the conductor layer 30a having the slit 31a is formed above the signal line 20 via the insulation layer 10 (an upper insulation layer 10a), and the conductor layer 30b having the slit 31b is formed below the signal line 20 via the insulation layer 10 (a lower insulation layer 10b). The circuit board 1A has a stripline structure in which the signal line 20 formed in the insulation layer 10 (insulation layers 10a and 10b) containing the glass cloth 12 is interposed between the conductor layer 30a having the slit 31a and the conductor layer 30b having the slit 31b.

In the circuit board 1A having the above-described structure, because the slits 31a and 31b are respectively formed in the conductor layers 30a and 30b, the skew of transmission signals due to the positional relationship between the signal line 20 and the dielectric-constant distribution of the insulation layer 10 is suppressed. This point will be described with reference to FIGS. 3A and 3B.

Figure 3A:
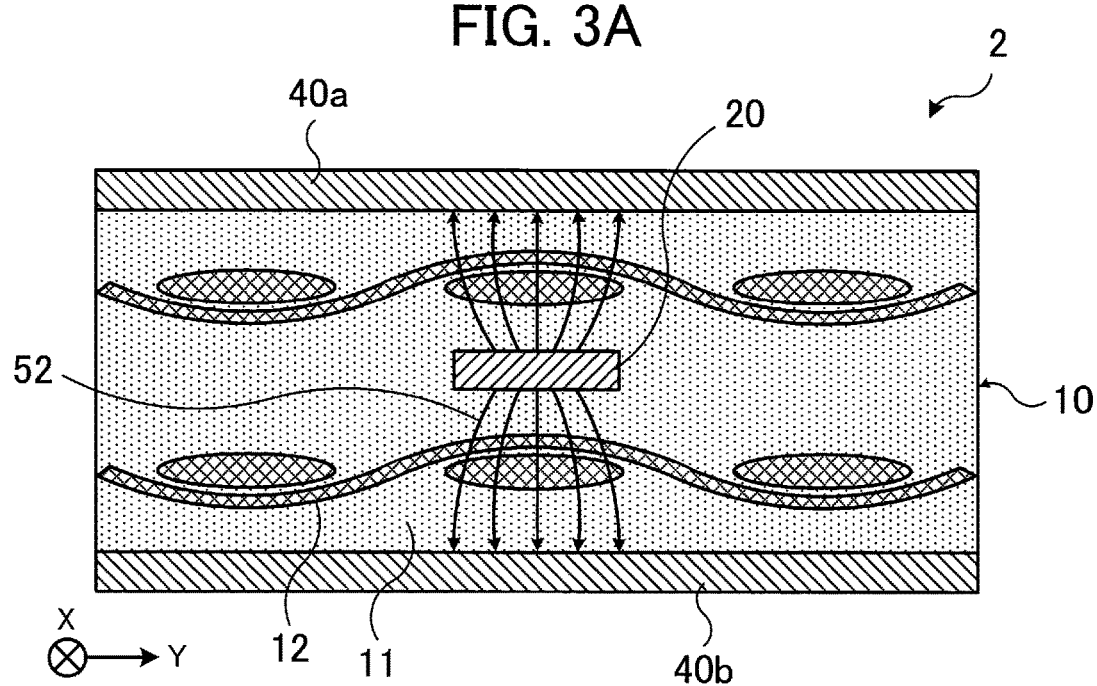
FIGS. 3A and 3B are explanatory diagrams of electric fields produced in circuit boards.
Figure 3B:
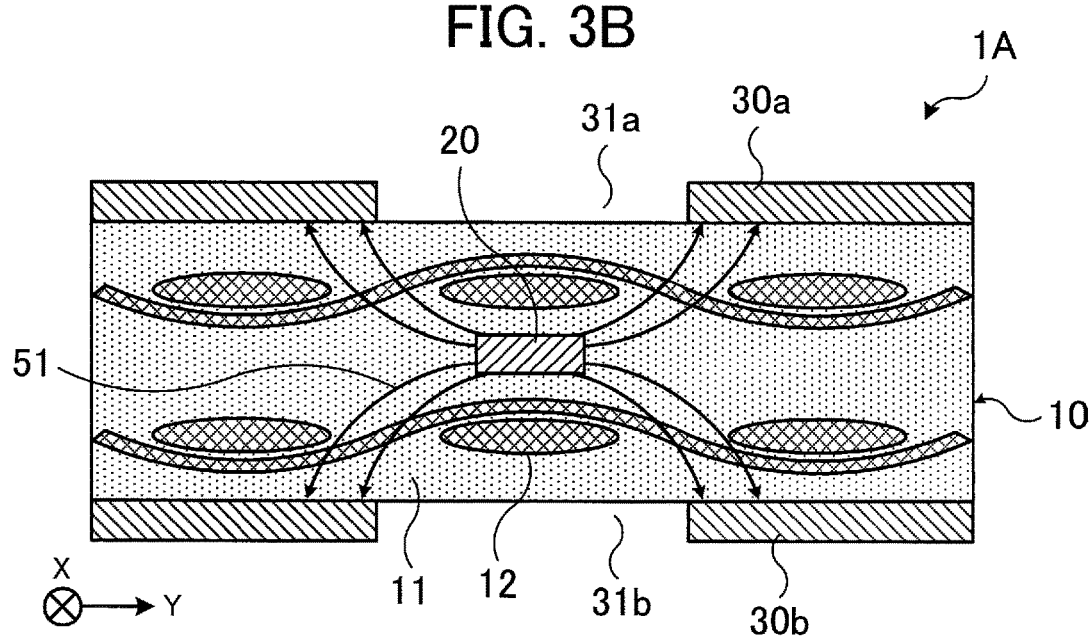

FIGS. 3A and 3B are explanatory diagrams of electric fields produced in circuit boards. FIG. 3A illustrates, as a comparative example, a circuit board in which the conductor layers have no slits. FIG. 3B illustrates the circuit board of the first embodiment, in which the conductor layers have slits.

Similar to the circuit board 1A of the first embodiment illustrated in FIG. 3B, a circuit board 2 illustrated in FIG. 3A includes the insulation layer 10, and the signal line 20 formed in the insulation layer 10. In the circuit board 2, a conductor layer 40a having no slit is formed over the insulation layer 10, and a conductor layer 40b having no slit is formed under the insulation layer 10. The difference in size (thickness) between the circuit board 2 illustrated in FIG. 3A and the circuit board 1A illustrated in FIG. 3B will be described later.

In the circuit board 2 illustrated in FIG. 3A, when a predetermined operation is performed, an electric field 52 is produced between the signal line 20 and conductor layer 40a, and between the signal line 20 and the conductor layer 40b, for example, in a direction from the signal line 20 toward the conductor layer 40a, and in a direction from the signal line 20 toward the conductor layer 40b.

In the circuit board 2, the dielectric constant of the insulation layer 10 in the vicinity of the signal line 20 varies depending on the positional relationship between the signal line 20 extending in the direction X and the dielectric-constant distribution of the insulation layer 10 in the direction Y. For example, the dielectric constant of the insulation layer 10 in the vicinity of the signal line 20 varies depending on whether the signal line 20 is directly above or below the warp yarn 12a extending in the direction X as illustrated in FIGS. 3A and 3B, or whether the signal line 20 is directly above or below a portion between adjacent warp yarns 12a (not illustrated).

The dielectric constant of the insulation layer in the vicinity of the signal line 20 affects the electric field 52 and the signal transmission speed of the signal line 20. The signal transmission speed of the signal line 20 in the vicinity of the insulation layer 10 having a relatively high dielectric constant tends to be slower than the signal transmission speed of the signal line 20 in the vicinity of the insulation layer 10 having a relatively low dielectric constant. In the circuit board 2 with the conductor layers 40a and 40b having no slits, the difference in the signal transmission speeds of the signal line 20 may occur, and the skew of the transmission signals may increase, depending on the positional relationship between the signal line 20 extending in the direction X and the dielectric-constant distribution of the insulation layer 10 in the direction Y.

On the other hand, in the circuit board 1A illustrated in FIG. 3B, when a predetermined operation is performed, an electric field 51 is produced between the signal line 20 and the conductor layer 30a, and between the signal line 20 and the conductor layer 30b, for example, in a direction from the signal line 20 toward the conductor layer 30a, and in a direction from the signal line 20 toward the conductor layer 30b.

In this time, because the conductor layers 30a and 30b of the circuit board 1A are respectively provided with the slits 31a and 31b at the positions corresponding to the signal line 20, the electric field 51 expands more than the electric field 52 of the circuit board 2. For example, when viewed in a cross section, the electric field 51 is expanding obliquely upward from the signal line 20 toward the conductor layer 30a, and obliquely downward from the signal line 20 toward the conductor layer 30b; when viewed in a plane, the electric field 51 is expanding from the signal line 20 toward the right and left directions.

Since the electric field 51 is expanding in this way in the circuit board 1A, the dielectric constant of the insulation layer 10 in the vicinity of the signal line less affects the electric field 51, compared to the case in which the slits 31a and 31b are not formed; and is averaged in a broader portion of the insulation layer 10.

Thus, in the circuit board 1A, the slits 31a and 31b expand the electric field 51 and cause less difference in dielectric constants of the insulation layer 10 in the vicinity of the signal line 20, regardless of which position the signal line 20, extending in the direction X, is positioned with respect to the dielectric-constant distribution of the insulation layer 10, distributed in the direction Y. With this structure, the difference in the signal transmission speeds of the signal line 20 extending in the direction X is reduced, and thus the skew of the transmission signals is suppressed, regardless of the positional relationship between the signal line 20 and the dielectric-constant distribution of the insulation layer 10 in the direction Y.

Next, the size and the skew suppression effect of the circuit board 1A will be described with reference to FIGS. 4A and 4B.

Figure 4A:
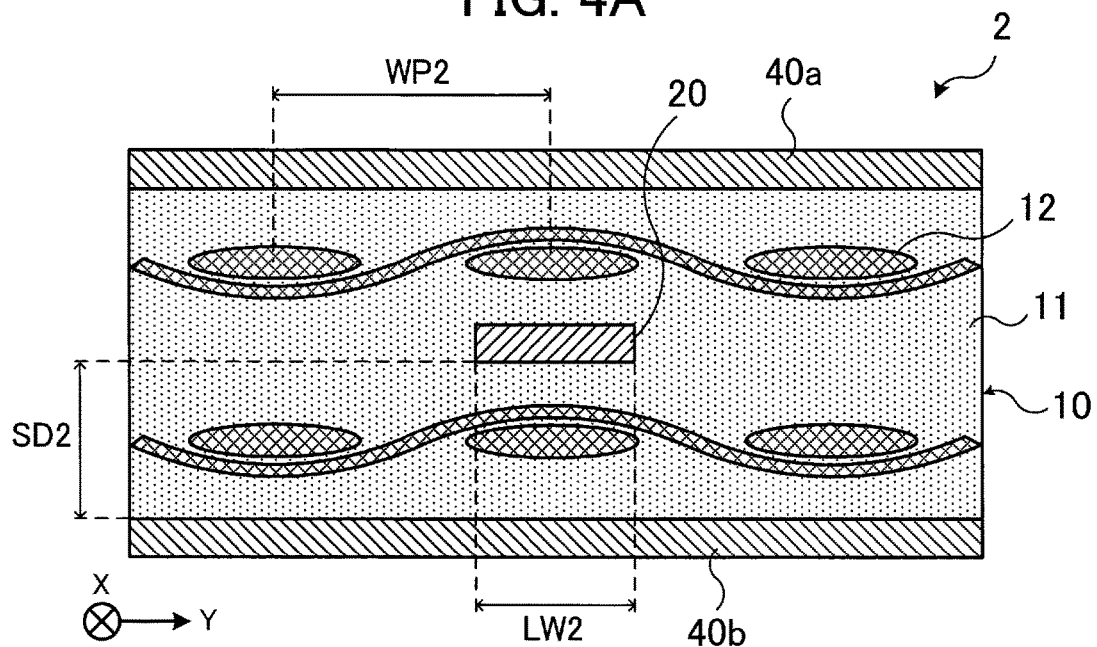
FIGS. 4A and 4B are explanatory diagrams of sizes of circuit boards.
Figure 4B:
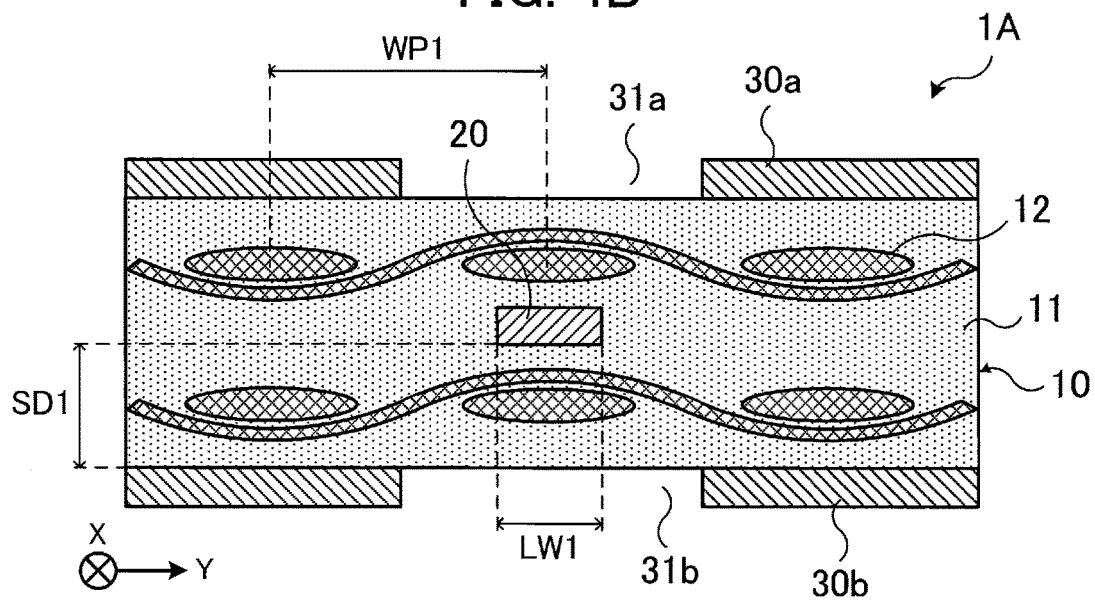

FIGS. 4A and 4B are explanatory diagrams of sizes of circuit boards. FIG. 4A illustrates, as a comparative example, a circuit board in which the conductor layers have no slits. FIG. 4B illustrates the circuit board of the first embodiment, in which the conductor layers have the slits.

For example, a glass yarn pitch WP2 (one cycle in the dielectric-constant distribution of the insulation layer 10 in the direction Y) of the glass cloth 12 is 270 μm. The glass cloth 12 is contained in the insulation layer 10 of the circuit board 2, which is illustrated in FIG. 4A and provided with no slits. A width LW2 of the signal line 20 formed in the insulation layer 10, which contains the glass cloth 12, is 162 μm. A distance SD2 between the signal line 20 and the conductor layer 40b (or between the signal line 20 and the conductor layer 40a) is 160 μm. With such a size, the circuit board 2 suppresses the skew of the transmission signals so that the level of the skew is within a certain value.

On the other hand, the circuit board 1A, which has the slits 31a and 31b illustrated in FIG. 4B, achieves the same level of skew, even when the width of the signal line 20 is smaller than that of the circuit board 2 and the thickness of the insulation layer 10 is thinner than that of the circuit board 2. For example, in the insulation layer 10 containing the glass cloth 12 whose pitch WP1 (one cycle in the dielectric-constant distribution of the insulation layer 10 in the direction Y) is 270 μm equal to the pitch WP2, the signal line 20 is formed with a width LW1 of 100 μm. In this case, a distance SD1 between the signal line 20 and the conductor layer 30b (or between the signal line 20 and the conductor layer 30a) is 100 μm. Even when the circuit board 1A is downsized, the slits 31a and 31b of the conductor layers 30a and 30b expand the electric field 51 so that the circuit board 1A causes less difference in the dielectric constants of the insulation layer 10 in the vicinity of the signal line 20 (the difference is caused by the positional relationship between the signal line 20 and the dielectric-constant distribution). Thus, the circuit board 1A suppresses the skew of the transmission signals.

The skew suppression effect by the circuit board 1A will be further described.

Figure 5:
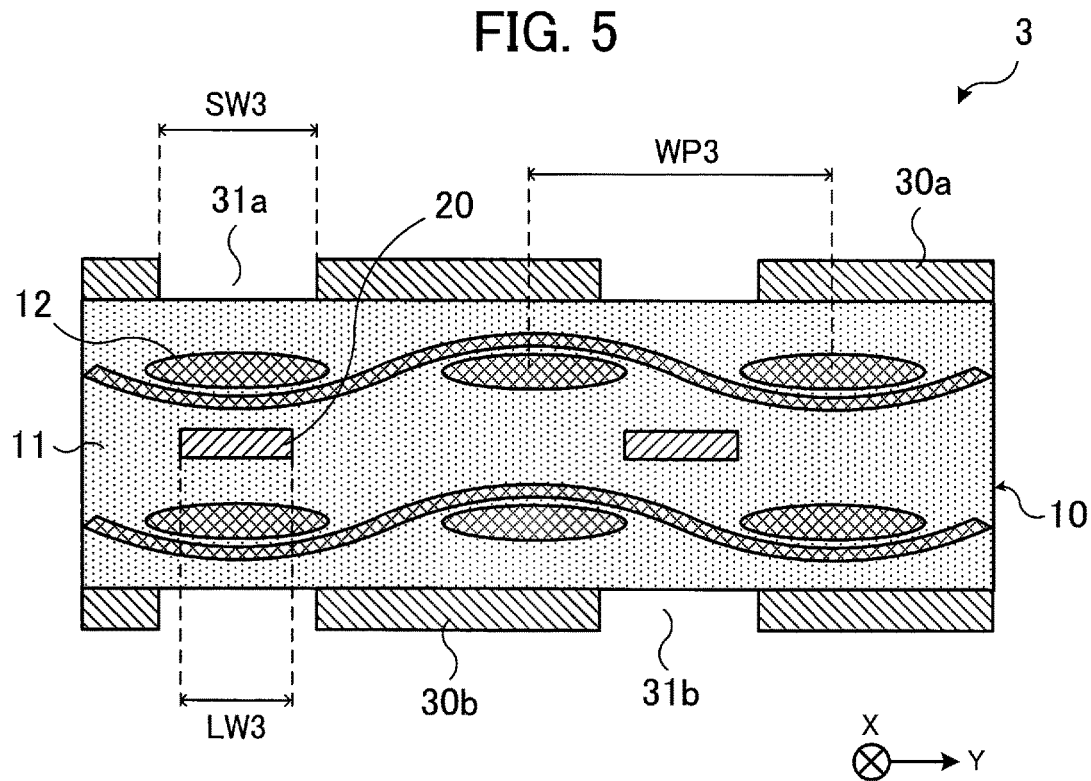
FIG. 5 illustrates one example of a model for a simulation according to the first embodiment.
Figure 6:
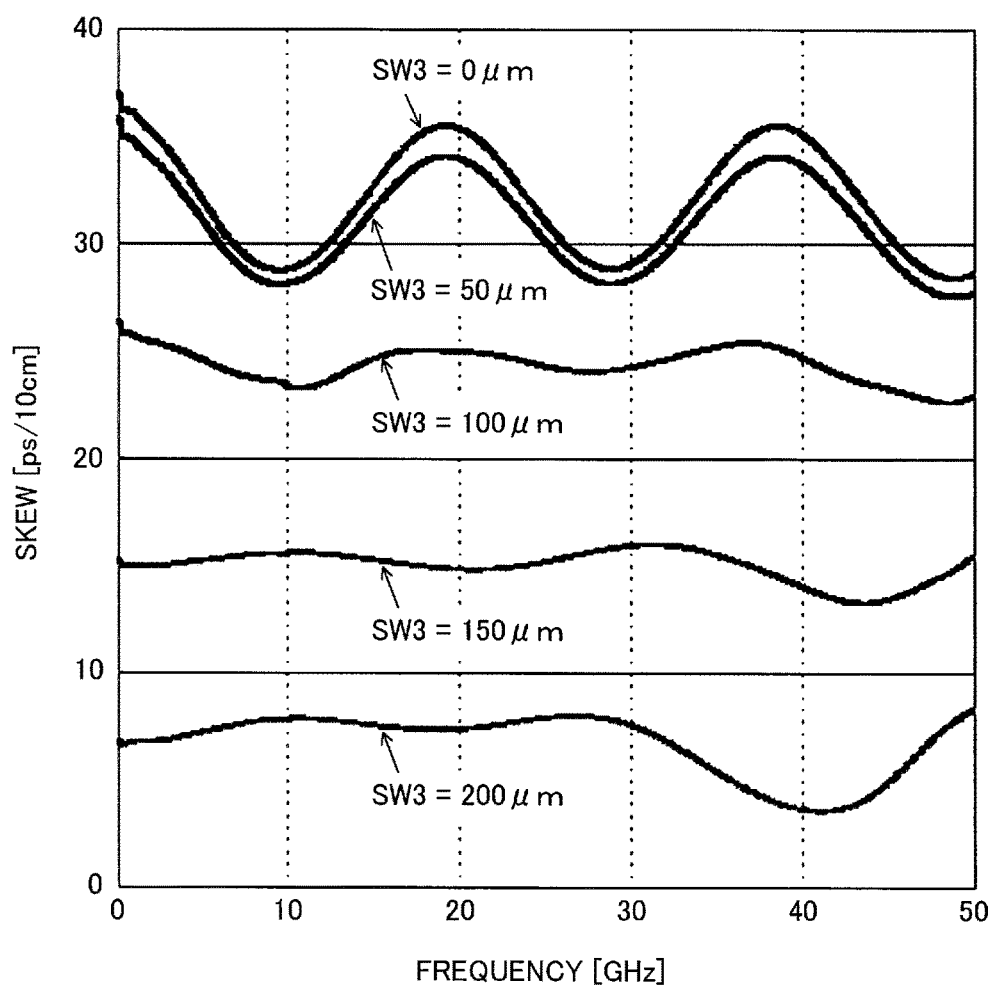
FIG. 6 illustrates one example of a simulation result according to the first embodiment.

FIG. 5 illustrates one example of a model for a simulation according to the first embodiment. FIG. 6 illustrates one example of a simulation result according to the first embodiment.

The relationship between the width of the slits 31a and 31b of the conductor layers 30a and 30b of the circuit board 1A and the skew of the transmission signals has been obtained through the simulation.

The simulation was performed by using a model 3 of the circuit board 1A, as illustrated in FIG. 5. In the model 3, a glass yarn pitch WP3 (one cycle in the dielectric-constant distribution of the insulation layer 10 in the direction Y) of the glass cloth 12 is 300 μm, and a width LW3 of the signal line 20 is 100 μm. By using the model 3, the skew was simulated in cases where the width SW3 of the slits 31a and 31b of the conductor layers 30a and 30b of the circuit board 1A is 50 μm, 100 μm, 150 μm, and 200 μm. For comparison, the skew was also simulated in a case where the width SW3 is 0 μm (this skew corresponds to a skew of the circuit board 2, which has no slits). The simulation result is illustrated in FIG. 6.

In FIG. 6, the horizontal axis represents the frequency [GHz] of the transmission signals transmitted along the signal line 20, and the vertical axis represents the skew [ps/10 cm] of the transmission signals. As seen from FIG. 6, the slits 31a and 31b of the conductor layers 30a and 30b suppress the skew, compared to the case where no slits are formed (SW3=0 μm). In the case where the width LW3 of the signal line 20 is 100 μm, as the width SW3 of the slits 31a and 31b is increased in the order of 50 μm, 100 μm, 150 μm, and 200 μm, the skew of the transmission signals is more suppressed.

In this case, when the width SW3 of the slits 31a and 31b is larger than the width LW3 of the signal line 20 of 100 μm, skew suppression effect is significantly produced. For example, when the width SW3 of the slits 31a and 31b is 200 μm, the skew is about 8 ps/10 cm. Thus, the skew is suppressed to about a quarter or less of the skew obtained when no slits are formed (SW3=0 μm).

As described above, in the circuit board 1A of the first embodiment, the signal line 20 is formed in the insulation layer 10 having the dielectric-constant distribution. In addition, the conductor layers 30a and 30b, between which the signal line 20 is interposed, are respectively provided with the slits 31a and 31b at the positions corresponding to the signal line 20. The slits 31a and 31b expand the electric field 51, which is produced between the signal line 20 and the slit 31a and between the signal line 20 and the slit 31b, and narrow difference in the dielectric constants of the insulation layer 10 in the vicinity of the signal line 20, which is caused by the positional relationship between the signal line 20 extending in the direction X and the dielectric-constant distribution of the insulation layer 10 in the direction Y. This structure reduces the difference in the signal transmission speeds of the signal line 20 extending in the direction X, and suppresses the skew of the transmission signals, regardless of the positional relationship between the signal line 20 and the dielectric-constant distribution of the insulation layer 10 in the direction Y.

In this embodiment, the circuit board 1A having the three-layer structure of the signal line 20 and a pair of the conductor layers 30a and 30b interposing the signal line 20 in-between has been described as an example. The circuit board 1A, however, may have a multilayer structure having four or more layers. In this structure, another conductor layer may be formed above the insulation layer 10a and the conductor layer 30a via another insulation layer, and another conductor layer may be formed below the insulation layer 10b and the conductor layer 30b via another insulation layer. Even in the circuit board 1A having the four or more layers, the same effect as that described in the above is produced by forming the slit 31a in the conductor layer 30a, and forming the slit 31b in the conductor layer 30b.

By the way, there is a known technique to improve the quality of signals in a high-frequency circuit board. The technique improves the quality by making the characteristic impedance of a signal transmission line close to a certain value (for example, 50Ω) to reduce reflection of signals. For making the characteristic impedance close to a desired value, one method increases or decreases the capacitance between a signal line and a conductor layer by adjusting the distance between the signal line and the conductor layer (having the ground potential, for example), or by adjusting the width of the signal line. When the characteristic impedance is to be increased, the thickness of an insulation layer is increased, or the width of the signal line is decreased. When the characteristic impedance is to be decreased, the thickness of the insulation layer is decreased, or the width of the signal line is increased. When the capacitance is not decreased by increasing the distance between the signal line and the conductor layer or decreasing the width of the signal line, a slit may be formed in the conductor layer to decrease the capacitance, for the matching of the characteristic impedance.

In the case of the circuit board 1A, in this connection, when the signal line 20 is formed in the insulation layer 10 having the dielectric-constant distribution, the slits 31a and 31b are respectively formed in the conductor layers 30a and 30b where difference in the dielectric constants in the vicinity of the signal line 20 is caused by the positional relationship between the signal line 20 and the dielectric-constant distribution of the insulation layer 10. The slits 31a and 31b expand the electric field 51 produced between the signal line 20 and the conductor layer 30a, and between the signal line 20 and the conductor layer 30b; cause less difference in the dielectric constants of the insulation layer 10 in the vicinity of the signal line 20 (the difference is caused by the positional relationship between the signal line 20 and the dielectric-constant distribution); and suppress the skew of the transmission signals, which are transmitted along the signal line 20 extending in the direction X, irrespective of the positional relationship between the signal line 20 and the dielectric-constant distribution of the insulation layer 10 in the direction Y.

Next, a second embodiment will be described.

Figure 7A:
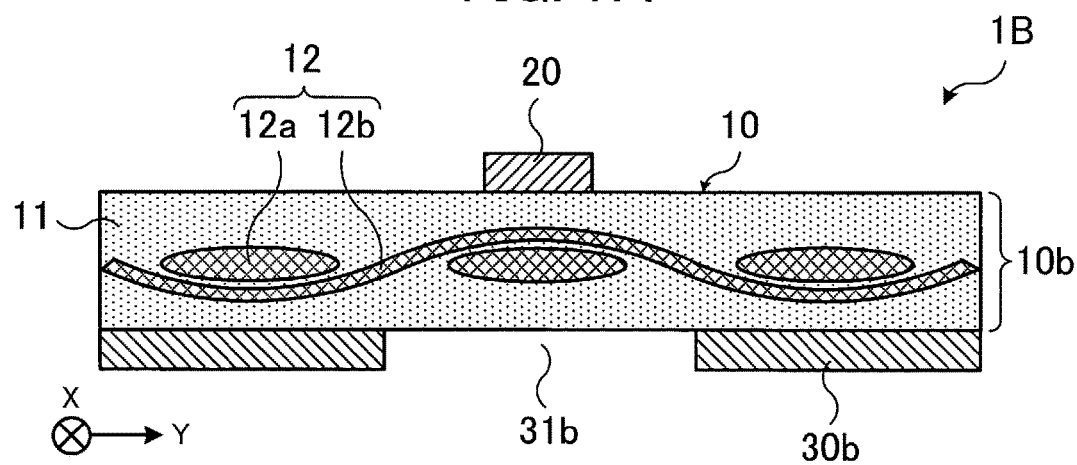
FIGS. 7A and 7B illustrate one example of a circuit board of a second embodiment.
Figure 7B:
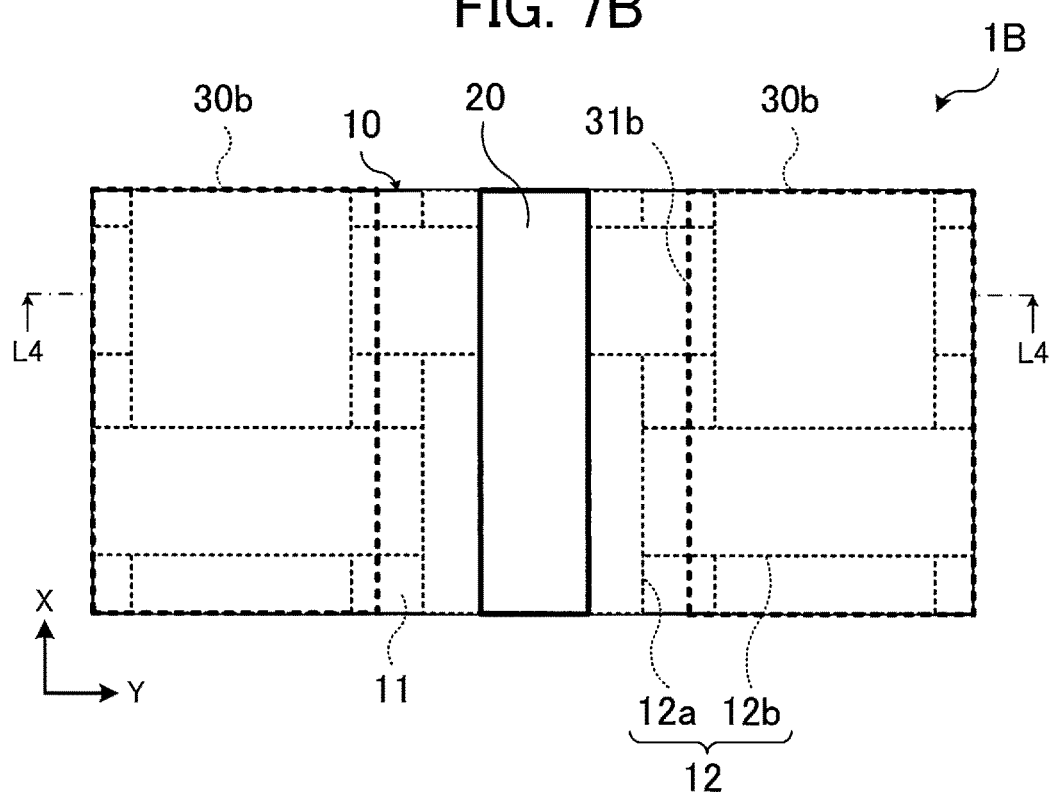

FIGS. 7A and 7B illustrate one example of a circuit board of the second embodiment. FIG. 7A schematically illustrates a cross section of a principal part of one example of the circuit board of the second embodiment. FIG. 7B schematically illustrates a plane of the principal part of one example of the circuit board of the second embodiment. Specifically, FIG. 7A schematically illustrates the cross section taken along a line L4-L4 of FIG. 7B.

A circuit board 1B illustrated in FIGS. 7A and 7B differs from the circuit board 1A of the first embodiment having the stripline structure, in that the circuit board 1B has a microstripline structure.

The circuit board 1B includes the insulation layer 10b (insulation layer 10), the signal line 20 formed over the insulation layer 10b, and the conductor layer 30b formed under the insulation layer 10b. In the insulation layer 10b, the periodic dielectric-constant distribution occurs due to the yarn pattern or the weave pattern of the glass cloth 12 in the resin 11. The conductor layer 30b is provided with the slit 31b at a position corresponding to the signal line 20, which extends in the direction X.

Also in the circuit board 1B having such a microstripline structure, the slit 31b of the conductor layer 30b expands an electric field produced between the signal line 20 and the conductor layer 30b; and causes less difference in the dielectric constants of the insulation layer 10b in the vicinity of the signal line 20 (the difference is caused by the positional relationship between the signal line 20 and the dielectric-constant distribution). This structure reduces the difference in the signal transmission speeds of the signal line 20 extending in the direction X, and suppresses the skew of the transmission signals, regardless of the positional relationship between the signal line 20 and the dielectric-constant distribution of the insulation layer 10b in the direction Y.

In this embodiment, the circuit board 1B having the two-layer structure of the signal line 20 and the conductor layer 30b has been described as an example. The circuit board 1B, however, may have a multilayer structure having three or more layers. In this structure, another conductor layer may be formed below the insulation layer 10b and the conductor layer 30b via another insulation layer. Even in the circuit board 1B having the three or more layers, the same effect as that described in the above is produced by forming the slit 31b in the conductor layer 30b.

Next, a third embodiment will be described.

Figure 8:
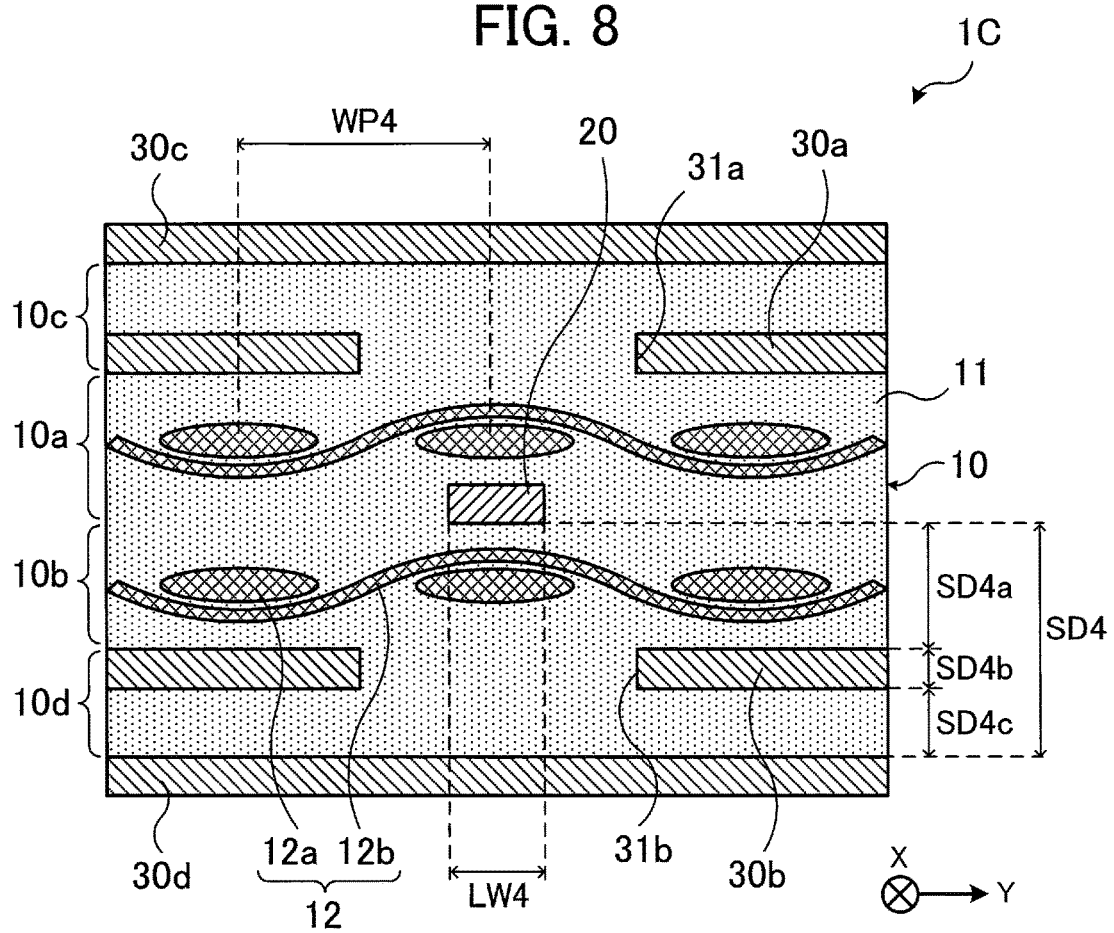
FIG. 8 illustrates one example of a circuit board of a third embodiment.

FIG. 8 illustrates one example of a circuit board of the third embodiment. FIG. 8 schematically illustrates a cross section of a principal part of one example of the circuit board of the third embodiment.

A circuit board 1C illustrated in FIG. 8 is one example of the circuit board which has a stripline structure and includes one portion of the structure of the circuit board 1A of the first embodiment. The circuit board 1C has a structure in which a conductor layer 30c is formed above the conductor layer 30a having the slit 31a, via an insulation layer 10c (one portion of the insulation layer 10), and in which a conductor layer 30d is formed below the conductor layer 30b having the slit 31b, via an insulation layer 10d (one portion of the insulation layer 10).

The conductor layers 30c and 30d of the circuit board 10 are not provided with the slits 31a and 31b, which are formed in the conductor layers 30a and 30b at the positions corresponding to the signal line 20. The conductor layers 30c and 30d function as an electromagnetic shield layer which prevents electromagnetic interference between transmission signals transmitted along the signal line 20 and transmission signals transmitted along another signal line, which is provided inside or outside the circuit board 1C. The conductor layers 30c and 30d may be made of any of various conductive materials. For example, the conductor layers 30c and 30d may be made of copper or a material containing copper. The conductor layers 30c and 30d may be made of aluminum, nickel (Ni), iron (Fe), ferrite, or the like.

The insulation layers 10c and 10d may also be made of the same resin 11 as the insulation layers 10a and 10b. The insulation layers 10c and 10d may be made without the glass cloth 12 contained in the insulation layers 10a and 10b.

For example, in the circuit board 1C, a glass yarn pitch WP4 (one cycle in the dielectric-constant distribution of the insulation layer 10 in the direction Y) of the glass cloth 12 is 300 μm, a width LW4 of the signal line 20 is 140 μm, a distance SD4 between the signal line 20 and the conductor layer 30d (or between the signal line 20 and the conductor layer 30c) is 168 μm. In this case, for example, a distance SD4a between the signal line 20 and the conductor layer 30b (or between the signal line 20 and the conductor layer 30a) is 100 μm, a thickness SD4b of the conductor layer 30b (or the conductor layer 30a) is 18 μm, a distance SD4c between the conductor layer 30b and the conductor layer 30d (or between the conductor layer 30a and the conductor layer 30c) is 50 μm.

In the circuit board 10, the slits 31a and 31b, which are respectively formed in the conductor layers 30a and 30b at the positions corresponding to the signal line 20, expand the electric field produced between the signal line 20 and the conductor layer 30a and between the signal line 20 and the conductor layer 30; and cause less difference in the dielectric constants of the insulation layer 10 in the vicinity of the signal line 20 (the difference is caused by the positional relationship between the signal line 20 and the dielectric-constant distribution). This structure suppresses the skew of the transmission signals, transmitted along the signal line 20 extending in the direction X, regardless of the positional relationship between the signal line 20 and the dielectric-constant distribution of the insulation layer 10 in the direction Y.

Furthermore, in the circuit board 10, the conductor layers 30c and 30d are formed as an electromagnetic shield layer, outside the conductor layers 30a and 30b having the respective slits 31a and 31b. The conductor layers 30c and 30d suppress the electromagnetic interference between transmission signals transmitted along the signal line 20 and transmission signals transmitted along another signal line.

Here, the circuit board 10 of the third embodiment will be compared with the circuit board 2 having the conductor layers 40a and 40b with no slits, as illustrated in FIG. 4A.

In the circuit board 2, the conductor layers 40a and 40b having no slits function as an electromagnetic shield layer. With the circuit board 2, to achieve a skew equivalent to the skew achieved by the circuit board 10 of the third embodiment when the pitch WP2 of the glass cloth 12 is 300 μm and is same as the circuit board 10, the width LW2 of the signal line 20 is 168 μm, and the distance SD2 between the signal line 20 and the conductor layer 40b (or between the signal line 20 and the conductor layer 40a) is 178 μm. Thus, even though the circuit board 2 has the three-layer structure of the signal line 20 and the conductor layers 40a and 40b, the circuit board 2 becomes thicker, to achieve the sufficient skew suppression effect, than the five-layer structure circuit board 10, which includes the signal line 20, the conductor layers 30a and 30b, and the conductor layers 30c and 30d disposed outside the conductor layers 30a and 30b.

Thus, the circuit board 10 achieves the structure in which the above-described skew suppression effect for the transmission signals and the electromagnetic interference suppression effect are gained, without being upsized. In addition, it is possible to increase the density of the wiring of the circuit board 10.

Figure 9:
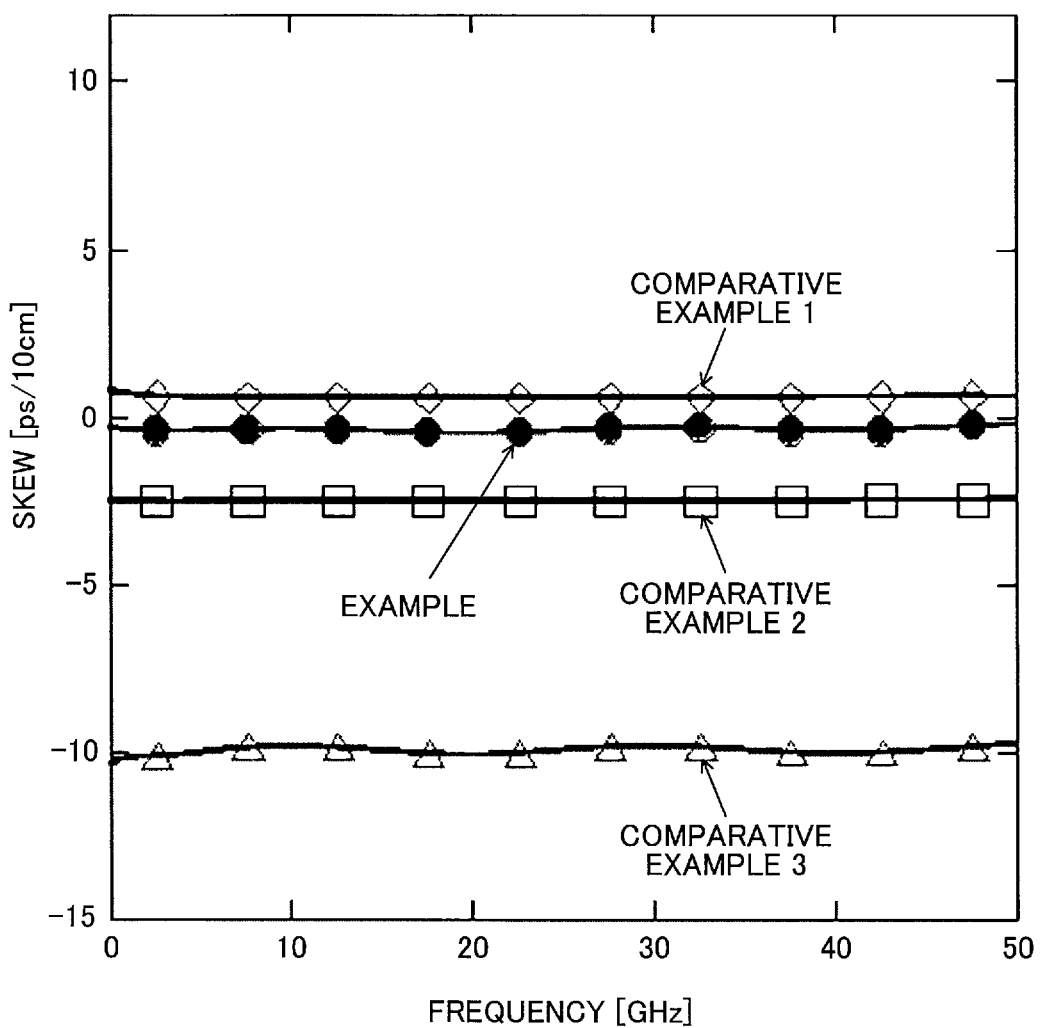
FIG. 9 illustrates one example of a simulation result of the circuit board of the third embodiment.

FIG. 9 illustrates one example of a simulation result of the circuit board of the third embodiment.

FIG. 9 illustrates the simulation result (indicated as "Example" in FIG. 9) of the skew of the transmission signals transmitted along the signal line 20.

The model used in the simulation has a structure corresponding to the structure of the circuit board 1C of FIG. 8, and has the pitch WP4 of 300 μm, the width LW4 of 140 μm, and the distance SD4 of 168 μm.

For comparison, another model corresponding to the circuit board 2 of FIG. 4A was used. Thus, FIG. 9 also illustrates simulation results of skews of the transmission signals transmitted along the signal line 20, using the other model. In the circuit board 2, the pitch WP2 is 300 μm equal to that of the circuit board 1C, and the width LW2 and the distance SD2 are: 170 μm and 180 μm (indicated as "Comparative Example 1" in FIG. 9); 160 μm and 170 μm (indicated as "Comparative Example 2" in FIG. 9); and 140 μm and 150 μm (indicated as "Comparative Example 3" in FIG. 9).

Here, in Example and Comparative Examples 1 to 3, the matching of characteristic impedance (50Ω) was also performed.

In FIG. 9, the horizontal axis represents the frequency [GHz] of the transmission signals transmitted along the signal line 20, and the vertical axis represents the skew [ps/10 cm] of the transmission signals. In FIG. 9, as to Comparative Examples 1 to 3, the simulated skews of Comparative Examples 2 and 3 are relatively large, and the simulated skew of Comparative Example 1 is relatively close to zero. The simulated skew of Example, which has the above-described size and corresponds to the circuit board 1C, is closer to Comparative Example 1, and is almost zero.

From the simulation results of Example and Comparative Example 1, as illustrated in FIG. 9, the skew suppression effect of the circuit board 1C (Example) is equal to or bigger than that of the circuit board 2 (Comparative Example 1), while downsized. Specifically, compared to the circuit board 2 (LW2=170 μm, SD2=180 μm), the circuit board 1C (LW4=140 μm, SD4=168 μm) is downsized by 30 μm in the width of the signal line 20, and about 10 μm in the thickness of the insulation layer 10 (upper side thickness or lower side thickness with respect to the signal line 20).

Next, the width of the slits 31a and 31b of the circuit board 1C will be described.

Figure 10A:
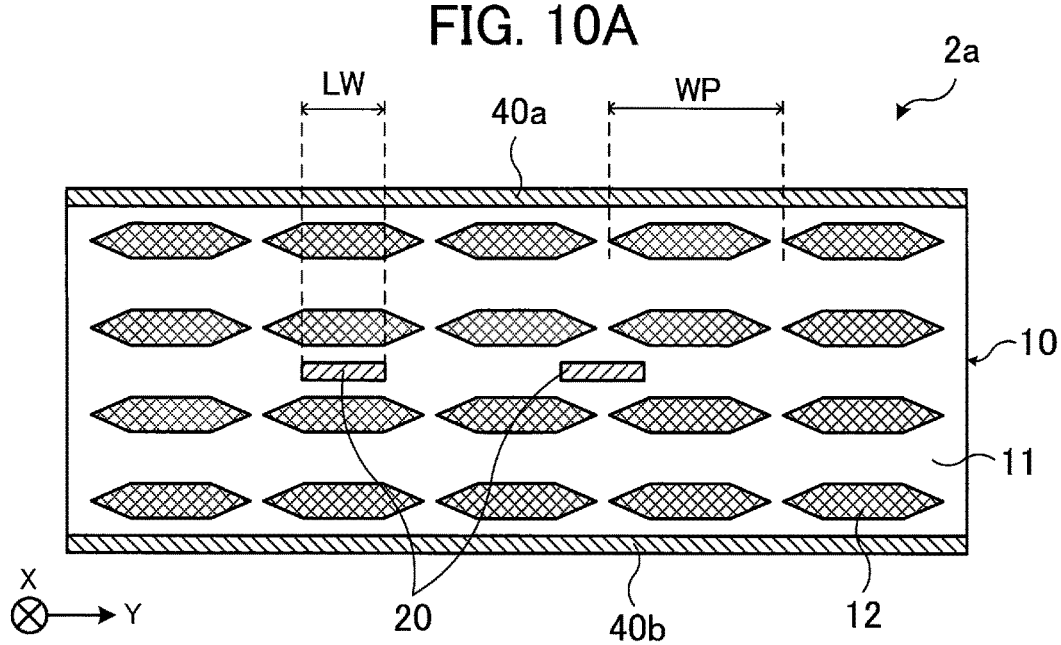
FIGS. 10A and 10B illustrate examples of models used for a simulation.
Figure 10B:
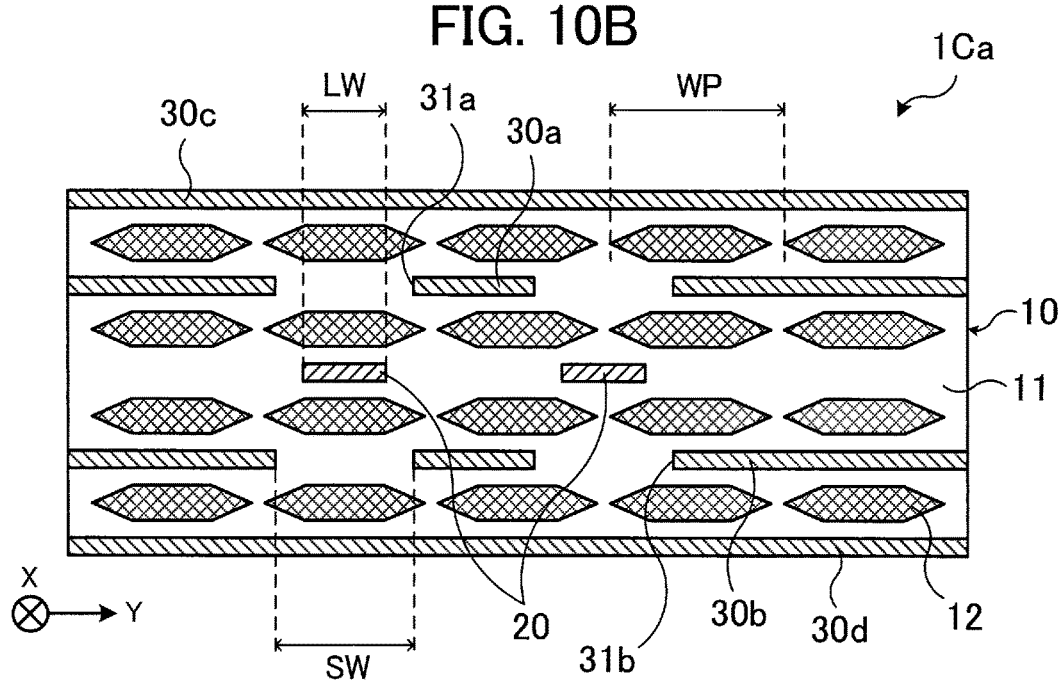
Figure 11:
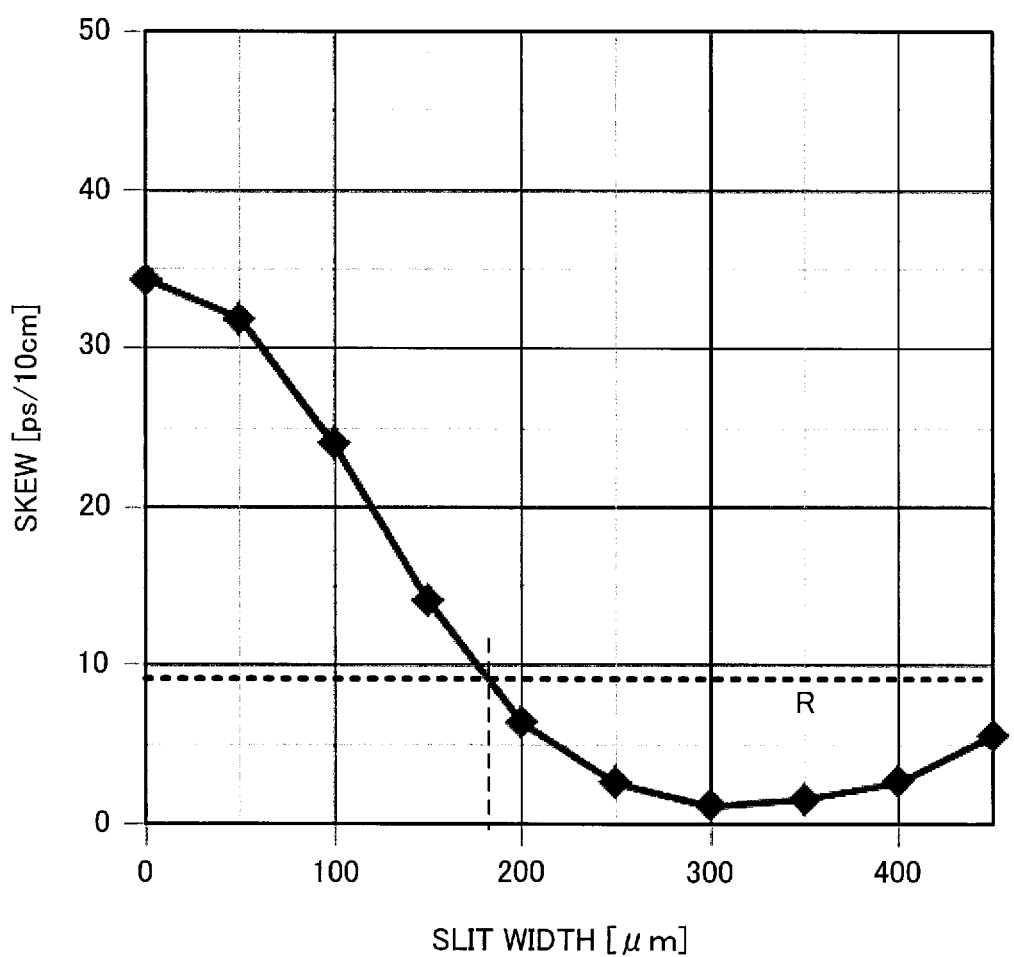
FIG. 11 illustrates one example of a simulation result.

FIGS. 10A and 10B illustrate examples of models used for a simulation. FIG. 11 illustrates one example of a simulation result.

Here, a model 2a corresponding to the circuit board 2 is illustrated in FIG. 10A, and another model 1Ca corresponding to the circuit board 1C is illustrated in FIG. 10B.

The model 2a illustrated in FIG. 10A contains two layers of glass cloth 12 between the signal line 20 and the conductor layer 40a, and two layers of glass cloth 12 between the signal line 20 and the conductor layer 40b.

The model 1Ca illustrated in FIG. 10B contains two layers of glass cloth 12 between the signal line 20 and the conductor layer 30c, and two layers of glass cloth 12 between the signal line 20 and the conductor layer 30d. The model 1Ca is provided with a conductor layer 30a between the two layers of glass cloth 12 disposed on the upper side of the signal line 20. The conductor layer 30a has, or does not have the slit 31a. In addition, the model 1Ca is provided with a conductor layer 30b between the two layers of glass cloth 12 disposed on the lower side of the signal line 20. The conductor layer 30b has, or does not have the slit 31b. Here, FIG. 10B illustrates the conductor layer 30a having the slit 31a and the conductor layer 30b having the slit 31b, for convenience.

In the models 2a and 1Ca, the glass yarn pitch WP (one cycle in the dielectric-constant distribution of the insulation layer 10) of the glass cloth 12 is 300 μm, and the width LW of the signal line is 155 μm. In the model 1Ca, the width SW of the slits 31a and 31b is varied in a range of 0 to 450 μm. The models 2a and 1Ca have an identical thickness of the insulation layer 10.

With such models 2a and 1Ca, the skew of the model 2a, and the skew of the model 1Ca obtained when the width SW of the slits 31a and 31b is varied, have been simulated. The simulation results are illustrated in FIG. 11.

In FIG. 11, the horizontal axis represents the width SW [μm] of the slits 31a and 31b of the model 1Ca, and the vertical axis represents the skew [ps/10 cm] of the transmission signals of the model 1Ca. The skew of the vertical axis is the average of skews obtained in a frequency range up to 50 GHz. The skew of the model 2a is 9.3 ps/10 cm which is illustrated by a dotted line R in FIG. 11.

In FIG. 11, the skew of the model 1Ca (FIG. 10B) tends to decrease as the width SW increases, in a rage of the width SW of the slits 31a and 31b up to 300 μm. In a rage of the width SW of the slits 31a and 31b from 300 to 450 μm, the skew tends to slightly increase as the width SW increases.

In the model 1Ca, the slits 31a and 31b (0<SW≤300 μm) expand the electric field produced between the signal line 20 and the conductor layer 30a and between the signal line 20 and the conductor layer 30b, as described above; and cause less difference in the dielectric constants of the insulation layer 10 in the vicinity of the signal line (the difference is caused by the positional relationship between the signal line 20 and the dielectric-constant distribution). With this effect, the skew of the transmission signals transmitted along the signal line 20 is suppressed.

However, when the width SW of the slits 31a and 31b exceeds the certain value (SW>300 μm), an electric field produced between the signal line 20 and the conductor layer 30c and between the signal line 20 and the conductor layer 30d reduces the effect of expanding the electric field by the slits 31a and 31b; and slightly increases the skew. That is, when the width SW of the slits 31a and 31b of the model 1Ca exceeds the certain value (SW>300 μm), the structure of the model 1Ca becomes substantially similar to the structure of the model 2a.

In FIG. 11, when the width SW of the slits 31a and 31b exceeds 180 μm, the model 1Ca is improved in skew compared to the model 2a (the skew of the model 1Ca becomes lower than 9.3 ps/10 cm indicated by the dotted line R). Thus, in the model 1Ca, or the circuit board 1C, when the pitch WP of the glass cloth 12 is 300 μm, and the width LW of the signal line 20 is 155 μm, the width SW of the slits 31a and 31b of the respective conductor layers 30a and 30b is preferably 180 μm or more.

The width of the slits 31a and 31b of the circuit board 1C will be further described.

Figure 12:
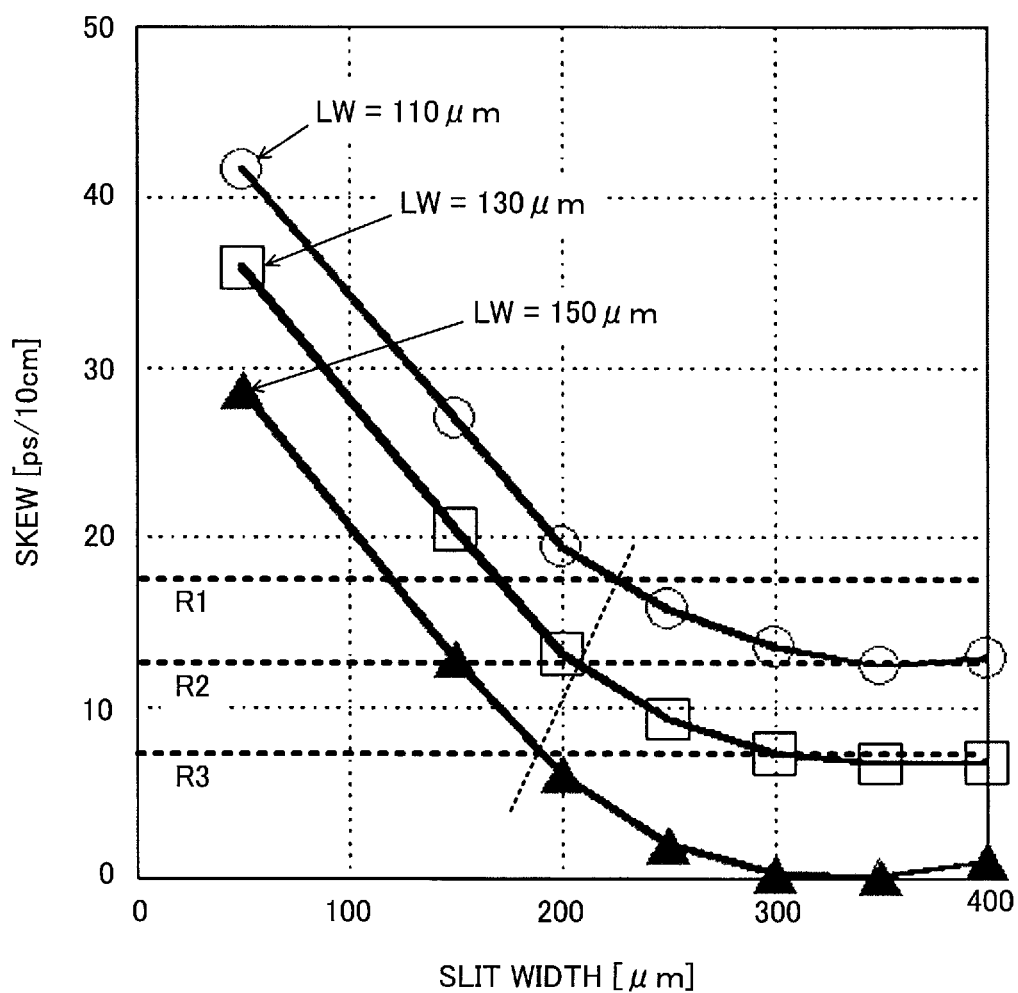
FIG. 12 illustrates another example of a simulation result.

FIG. 12 illustrates another example of a simulation result.

FIG. 12 illustrates the simulation result of the skew obtained when the width SW of the slits 31a and 31b is varied in the cases where the width LW of the signal line 20 of the above-described model 1Ca (FIG. 10B) is 110 μm, 130 μm, and 150 μm.

In FIG. 12, the horizontal axis represents the width SW [μm] of the slits 31a and 31b of the model 1Ca, and the vertical axis represents the skew [ps/10 cm] of the transmission signals of the model 1Ca. The skew of the vertical axis is the average of skews obtained in a frequency range up to 50 GHz. In addition, dotted lines R1, R2, and R3 illustrated in FIG. 12 respectively indicate skews obtained in the cases where the width LW of the signal line 20 of the above-described model 2a (FIG. 10A) is 110 μm, 130 μm, and 150 μm. The skew indicated by the dotted line R1 is 17.3 ps/10 cm, the skew indicated by the dotted line R2 is 12.6 ps/10 cm, and the skew indicated by the dotted line R3 is 7.3 ps/10 cm. Here, in both the models 1Ca and 2a, the glass yarn pitch WP of the glass cloth 12 is 300 μm.

In FIG. 12, as the width LW of the signal line 20 of the model 1Ca is increased in the order of 110 μm, 130 μm, and 150 μm, a width SW of the slits 31a and 31b at which the skew of the model 1Ca becomes better than the skew of the model 2a (that is, at which the skew of the model 1Ca becomes lower than the skew indicated by one of the dotted lines R1 to R3) tends to be smaller.

Here, the value (SW+LW)/2 which is half the sum of the width LW of the signal line 20 and the width SW of the slits 31a and 31b is one indicator which indicates the size of the expanded electric field produced between the signal line 20 and the conductor layer 30a, and between the signal line 20 and the conductor layer 30b. As a result of our research, it is found that when the value (SW+LW)/2 is substantially equal to or larger than half the pitch WP of the glass cloth 12 ((SW+LW)/2≥WP/2), the above-described skew suppression effect is obtained.

In addition, in order to effectively expand the electric field, the edges of each of the slits 31a and 31b are preferably positioned outside a portion directly above or below the signal line 20, not inside the portion. That is, the width SW of the slits 31a and 31b is preferably equal to or larger than the width LW of the signal line 20 (SW≥LW).

That is, when the following inequalities (1) and (2) are satisfied, the five-layer structure circuit board 1C gains the skew suppression effect.

$$SW+LW \geq WP \quad (1)$$

$$SW \geq KW \quad (2)$$

Thus, when the circuit board 1C is designed and manufactured so as to satisfy the inequalities (1) and (2), the skew is effectively suppressed.

In this embodiment, the circuit board 1C having the five-layer structure which includes the signal line 20, the conductor layers 30a and 30b, and the conductor layers 30c and 30d has been described as an example. The circuit board 10, however, may have a multilayer structure having six or more layers. In this structure, another conductor layer may be formed above the insulation layer 10c and the conductor layer 30c via another insulation layer, and another conductor layer may be formed below the insulation layer 10d and the conductor layer 30d via another insulation layer. Even in the circuit board 1C having the six or more layers, the same effect as described in the above is produced by forming the slit 31a in the conductor layer 30a, and forming the slit 31b in the conductor layer 30b.

By the way, when the characteristic impedance is adjusted by forming slits, it is unusual to form two layers of ground or power on the upper or lower side (one side) of the signal line 20, as in the circuit board 1C. In other words, the five-layer structure, which the circuit board 1C has, for example, is not used for matching the characteristic impedance, except for use in suppression of the skew. The reason will be described below.

Commonly, when the characteristic impedance is increased in the adjustment of the characteristic impedance, the thickness of the insulation layer is increased, or the width of the signal line is decreased. When the characteristic impedance is decreased, the thickness of the insulation layer is decreased, or the width of the signal line is increased. Forming a slit in a conductor layer which has no slit will increase the characteristic impedance, similar to increasing the thickness of the insulation layer.

Here, in a method of increasing the characteristic impedance by using a slit, a comparison will be made for a one-side two-layer structure and a one-side one-layer structure which is commonly used. In the one-side two-layer structure, one conductor layer close to the signal line has a slit, and the other conductor layer far from the signal line has no slit. It is possible to obtain the same effect by the one-side one-layer structure as the one-side two-layer structure, by forming one conductor layer at a position which corresponds to an intermediate position between the one conductor layer (having a slit) close to the signal line of the one-side two-layer structure and the other conductor layer (having no slit) far from the signal line of the one-side two-layer structure. Such a one-side one-layer structure has the less number of layers and enables the board to be thinner. Because the number of layers and the thickness of the board are increased, the one-side two-layer structure is not used in general for adjusting the characteristic impedance. In other words, the use of the one-side two-layer structure for adjusting the characteristic impedance does not lead to downsizing but leads to upsizing.

That is, the stripline structure having two layers of one conductor layer with a slit and the other conductor layer with no slit on one side is not used because of increasing the width of the signal line and the thickness of the board, except for use in suppression of the skew. However, the one-side two-layer structure enables the width of the signal line and the thickness of the board to be smaller than the conventional technique, in consideration of both the skew and the electromagnetic shield. That is, the one-side two-layer structure is suitable for downsizing of the signal line when the skew is suppressed in high-speed signal transmission.

Next, a fourth embodiment will be described.

Figure 13:
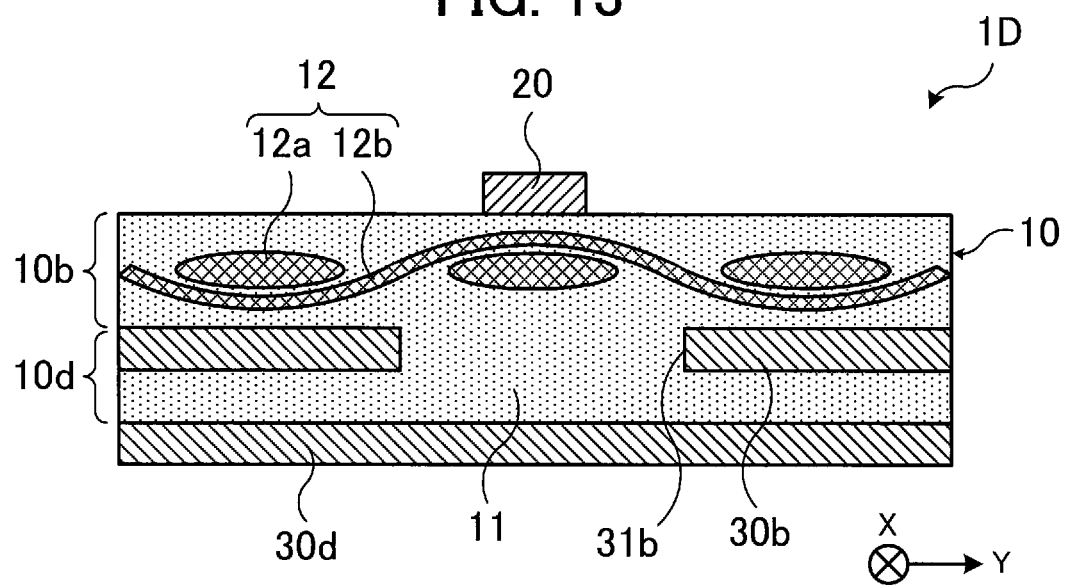
FIG. 13 illustrates one example of a circuit board of a fourth embodiment.

FIG. 13 illustrates one example of a circuit board of the fourth embodiment. FIG. 13 schematically illustrates a cross section of a principal part of one example of the circuit board of the fourth embodiment.

A circuit board 1D illustrated in FIG. 13 differs from the circuit board 10 of the third embodiment having the stripline structure, in that the circuit board 10 has a microstripline structure.

The circuit board 1D includes the insulation layers 10b and 10d (insulation layer 10), the signal line 20, the conductor layer 30b having the slit 31b, and the conductor layer 30d which functions as an electromagnetic shield layer. At least the insulation layer 10b of the insulation layers 10b and 10d contains the glass cloth 12 in the resin 11. In the insulation layer 10b (or the insulation layers 10b and 10d), the periodic dielectric-constant distribution occurs due to the yarn pattern or the weave pattern of the glass cloth 12 in the resin 11. The slit 31b of the conductor layer 30b is formed at a position corresponding to the signal line 20, which extends in the direction X. The conductor layer 30d is formed so as to cover the conductor layer 30b having the slit 31b.

Also in the circuit board 1D having such a microstripline structure, the slit 31b expands an electric field produced between the signal line 20 and the conductor layer 30b, and causes less difference in the dielectric constants in the vicinity of the signal line 20 (the difference is caused by the positional relationship between the signal line 20 and the dielectric-constant distribution). This structure reduces the difference in the signal transmission speeds of the signal line 20 extending in the direction X, and suppresses the skew of the transmission signals, regardless of the positional relationship between the signal line 20 and the dielectric-constant distribution of the insulation layer 10b (or the insulation layers 10b and 10d) in the direction Y.

In this embodiment, the circuit board 1D having the three-layer structure which includes the signal line 20, the conductor layer 30b, and the conductor layer 30d has been described as an example. The circuit board 1D, however, may have a multilayer structure having four or more layers. In this structure, another conductor layer may be formed below the insulation layer 10d and the conductor layer 30d via another insulation layer. Even in the circuit board 1D having the four or more layers, the same effect as described in the above is produced by forming the slit 31b in the conductor layer 30b.

Next, a fifth embodiment will be described.

FIGS. 14A and 14B illustrate examples of a circuit board of the fifth embodiment. FIG. 14A schematically illustrates a cross section of a principal part of one example of the circuit board of the fifth embodiment. FIG. 14B schematically illustrates a cross section of a principal part of another example of the circuit board of the fifth embodiment.

A circuit board 1E illustrated in FIG. 14A has a stripline structure, and has three layers of the signal line 20, the conductor layer 30a, and the conductor layer 30b. The circuit board 1E includes, as the insulation layer 10, an insulation layer 10a formed on the upper side of the signal line 20, and an insulation layer 10b formed on the lower side of the signal line 20. The insulation layer 10a contains a glass cloth 12c having a pitch WPc (one cycle in the dielectric-constant distribution in the direction Y). The insulation layer 10b contains a glass cloth 12d having a pitch WPd (one cycle in the dielectric-constant distribution in the direction Y). The pitch WPd differs from the pitch WPc. FIG. 14A illustrates the circuit board 1E in which the pitch WPd of the glass cloth 12d contained in the insulation layer 10b formed on the lower side of the signal line 20 is larger (wider) than the pitch WPc of the glass cloth 12c contained in the insulation layer 10a formed on the upper side of the signal line 20.

The circuit board 1E including the insulation layer 10 is provided with the conductor layer 30a formed over the insulation layer 10a and the conductor layer 30b formed under the insulation layer 10b. In the circuit board 1E, the conductor layer 30b, of the conductor layers 30a and 30b, which is formed on the bottom surface of the insulation layer 10b containing the glass cloth 12d having the relatively large pitch WPd, is provided with the slit 31b at a position corresponding to the signal line 20.

In the circuit board 1E, the dielectric constant of the insulation layer 10b is relatively high and tends to significantly vary, due to the glass cloth 12d. Therefore, the electric field produced between the signal line 20 and the conductor layer 30b via the insulation layer 10b interposed in-between is expanded to suppress the skew of the transmission signals transmitted along the signal line 20.

A circuit board 1F illustrated in FIG. 14B has a stripline structure, and has three layers of the signal line 20, the conductor layer 30a, and the conductor layer 30b. The circuit board 1F differs from the circuit board 1E illustrated in FIG. 14A, in that the conductor layer 30a, formed on the top surface of the insulation layer 10a containing the glass cloth 12c having the relatively smaller pitch WPc, is also provided with the slit 31a at a position corresponding to the signal line 20. In the circuit board 1F, the slit 31a of the conductor layer 30a is narrower than the slit 31b of the conductor layer 30b, for example.

In the circuit board 1F, the electric field produced between the signal line 20 and the conductor layer 30a, and the electric field produced between the signal line 20 and the conductor layer 30b are both expanded by the slits 31a and 31b. The ratio of the width of the slit 31a to the width of the slit 31b is adjusted so that the ratio becomes equal to the ratio of the pitch WPc of the glass cloth 12c to the pitch WPd of the glass cloth 12d. With this adjustment, the influence exerted by the dielectric constant and the electric field in the insulation layer 10 on the upper side of the signal line 20 becomes substantially equal to the influence exerted by the dielectric constant and the electric field in the insulation layer 10 on the lower side of the signal line 20. As a result, the skew of the transmission signals transmitted along the signal line 20 is effectively suppressed.

Thus, in accordance with the dielectric-constant distribution of the insulation layer 10 caused by the glass cloths 12c and 12d, only the conductor layer 30b of the conductor layers 30a and 30b may be provided with the slit 31b, or the widths of the slits 31a and 31b formed in the conductor layers 30a and 30b may be adjusted.

In this embodiment, the circuit boards 1E and 1F having the three-layer structure which each include the signal line 20, the conductor layer 30a, and the conductor layer 30b have been described as examples. The circuit boards 1E and 1F, however, may have a multilayer structure having four or more layers. In this structure, another conductor layer may be formed above the insulation layer 10a and the conductor layer 30a via another insulation layer, and another conductor layer may be formed below the insulation layer 10b and the conductor layer 30b via another insulation layer. Even in the circuit boards 1E and 1F having the four or more layers, the same effect as described in the above is produced by forming the slit 31b in the conductor layer 30b, or forming the slits 31a and 31b in the respective conductor layers 30a and 30b.

Next, a sixth embodiment will be described.

Figure 15:
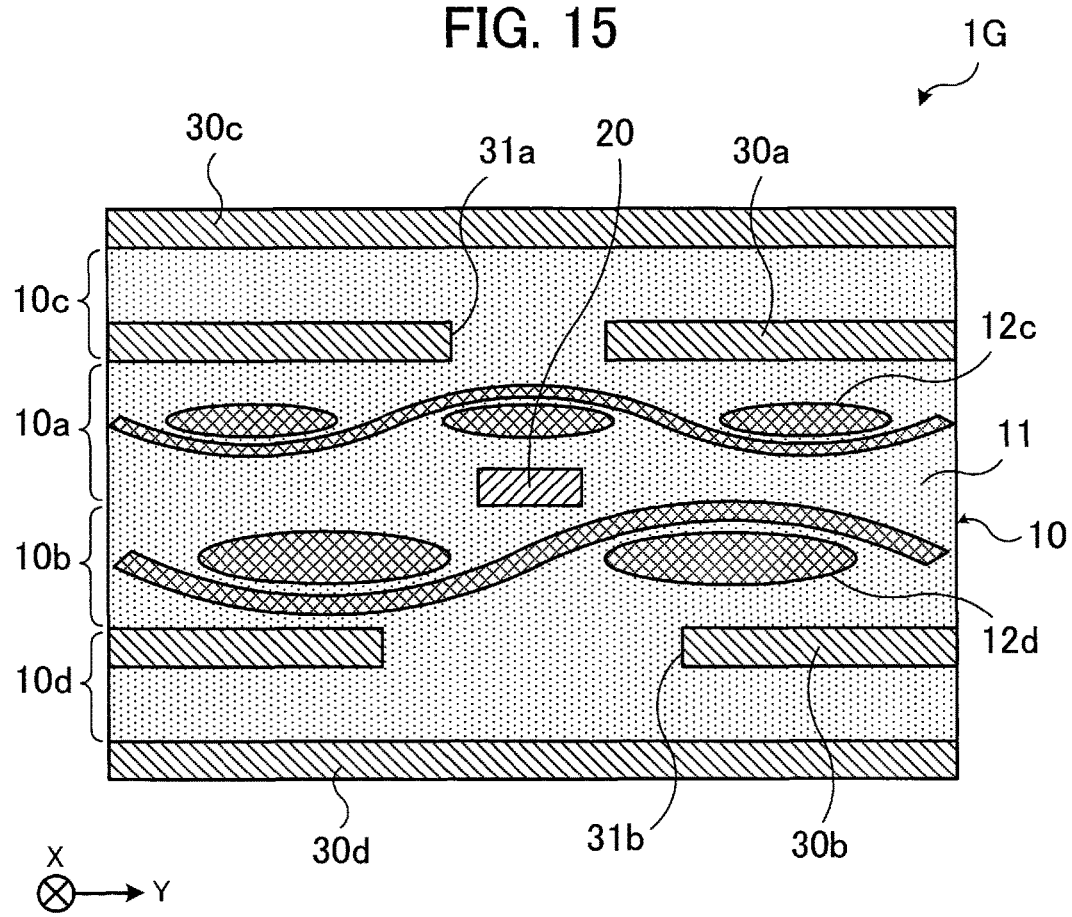
FIG. 15 illustrates one example of a circuit board of a sixth embodiment.

FIG. 15 illustrates one example of a circuit board of the sixth embodiment. FIG. 15 schematically illustrates a cross section of a principal part of one example of the circuit board of the sixth embodiment.

A circuit board 1G illustrated in FIG. 15 has a structure in which, in addition to the structure of the circuit board 1F (FIG. 14B) of the fifth embodiment, the conductor layer 30c is formed above the conductor layer 30a via the insulation layer 10c and the conductor layer 30d is formed below the conductor layer 30b via the insulation layer 10d. The circuit board 1G has a five-layer structure. In the five-layer structure, the conductor layers 30c and 30d, which serve as an electromagnetic shield layer, have been added to the circuit board 1F which has the stripline structure with the three layers of the signal line 20, the conductor layer 30a, and the conductor layer 30b.

The circuit board 1G suppresses the skew of the transmission signals transmitted along the signal line 20, and the electromagnetic interference between signals transmitted along the signal line 20 and signals transmitted along other signal lines.

The circuit board 1G, however, may have a multilayer structure having six or more layers. In this structure, another conductor layer may be formed above the insulation layer 10c and the conductor layer 30c via another insulation layer, and another conductor layer may be formed below the insulation layer 10d and the conductor layer 30d via another insulation layer.

Next, a seventh embodiment will be described.

Figure 16:
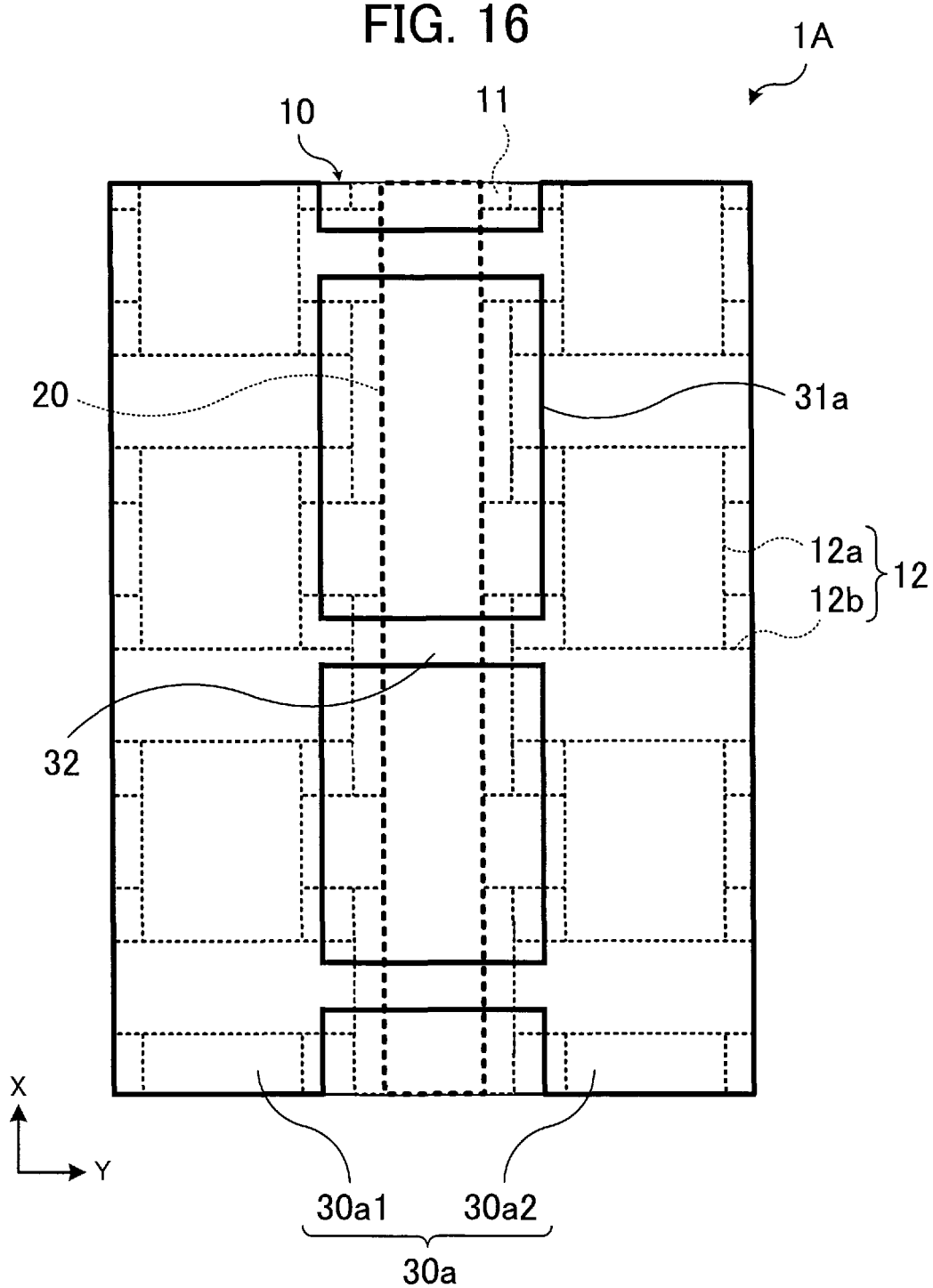
FIG. 16 illustrates one example of a circuit board of a seventh embodiment.

FIG. 16 illustrates one example of a circuit board of the seventh embodiment. FIG. 16 schematically illustrates a plane of a principal part of one example of the circuit board of the seventh embodiment.

The conductor layer 30a having the slit 31a as described above is not necessarily divided by the slit 31a. Similarly, the conductor layer 30b having the slit 31b is not necessarily divided by the slit 31b.

FIG. 16 illustrates another example of the conductor layer 30a of the circuit board 1A (FIGS. 2A and 2B) of the first embodiment. The conductor layer 30a is provided with the slit 31a at a position corresponding to the signal line 20 formed in the insulation layer 10, which contains the glass cloth 12. A left portion 30a1 and a right portion 30a2 of the conductor layer 30a, between which the slit 31a is interposed, is not necessarily divided, and may be electrically connected with each other by one or more connection lines 32 (FIG. 16 illustrates three connection lines 32, as one example).

When the left portion 30a1 and the right portion 30a2 of the conductor layer 30a are intended to be electrically connected with each other in the same layer, and when even the slit 31a having a predetermined number of connection lines 32 will produce a sufficient skew suppression effect, the left and right portions 30a1 and 30a2 may be connected with each other by the connection lines 32 in this manner. In addition, the left portion 30a1 and the right portion 30a2 may be connected with each other by the connection lines 32, in accordance with the connection between the conductor layer 30a and another conductor (disposed in the same layer as the conductor layer 30a, or in a different layer from that of the conductor layer 30a), or with the inductance of the conductor layer 30a and the influence exerted by the inductance.

For example, the conductor layer 30a is structured such that the left portion 30a1 and the right portion 30a2 are connected with each other by the connection lines 32 at intervals of 5 mm in the longitudinal direction of the slit 31a. At each interval, the left portion 30a1 and the right portion 30a2 are connected with each other by the connection line 32 by a length of 0.5 mm in the longitudinal direction, and separated from each other by the slit by the remaining length of 4.5 mm.

Here, although the description has been made for the conductor layer 30a of the circuit board 1A, the same holds true in the conductor layer 30b formed opposite to the conductor layer 30a. In this case, a left portion and a right portion of the conductor layer 30b, between which the slit 31b is interposed, may be electrically connected with each other by one or more connection lines.

In addition, although the connecting method that uses the connection lines 32 has been described for the circuit board 1A of the first embodiment, as an example, it may also be applied to conductor layers having a slit of the other circuit boards of the second to the sixth embodiments. That is, the above-described method may be applied to the conductor layer 30b of the circuit board 1B (FIGS. 7A and 7B), the conductor layers 30a and 30b of the circuit board 1C (FIG. 8), the conductor layer 30b of the circuit board 1D (FIG. 13), the conductor layer 30b of the circuit board 15 (FIG. 14A), the conductor layers 30a and 30b of the circuit board 1F (FIG. 14B), and the conductor layers 30a and 30b of the circuit board 1G (FIG. 15).

Next, an eighth embodiment will be described.

Figure 17A:
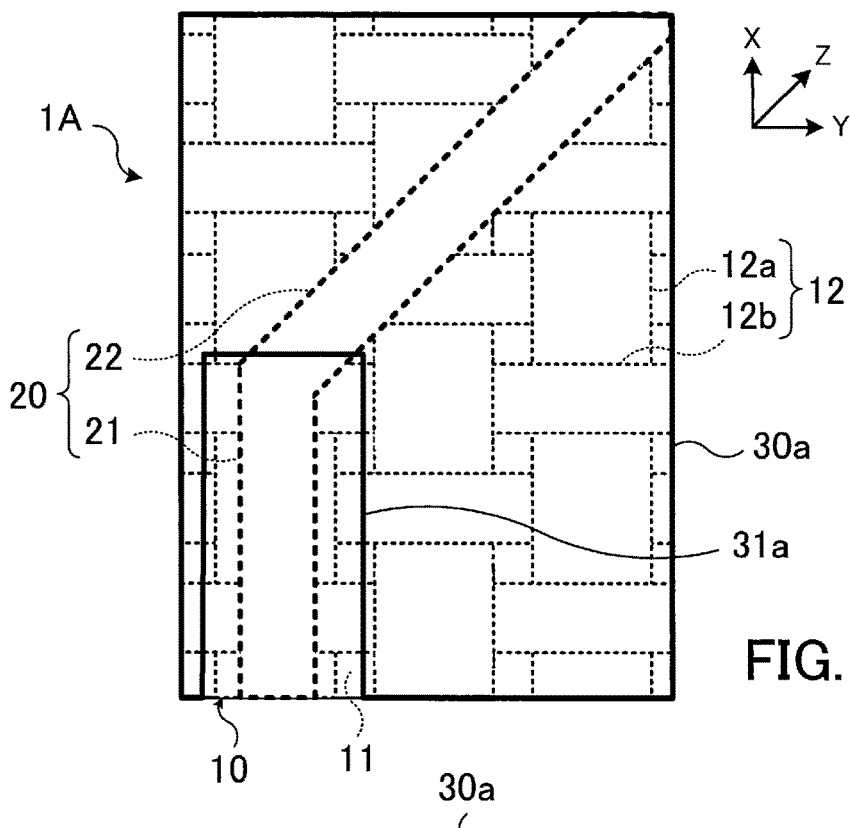
FIGS. 17A and 17B illustrate examples of a circuit board of an eighth embodiment.
Figure 17B:
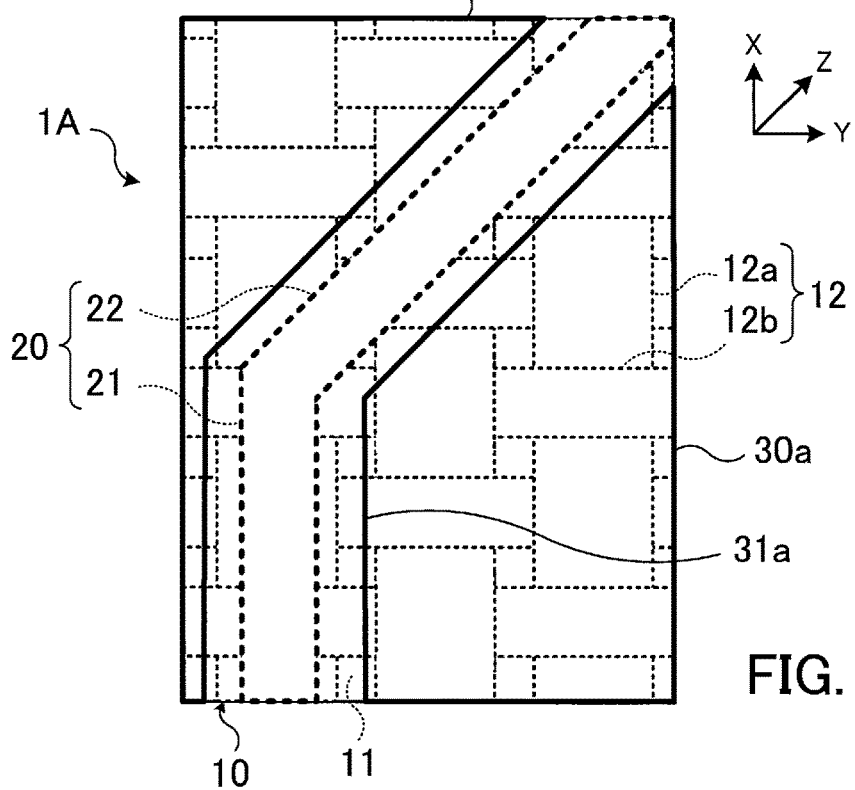

FIGS. 17A and 17B illustrate examples of a circuit board of the eighth embodiment. FIG. 17A schematically illustrates a plane of a principal part of a first example of the circuit board of the eighth embodiment. FIG. 17B schematically illustrates a plane of a principal part of a second example of the circuit board of the eighth embodiment.

Although the first to the seventh embodiments illustrate the signal line 20 extending straight in the predetermined direction (direction X), the signal line 20 is not limited to one extending straight.

FIGS. 17A and 17B illustrate the other examples of the circuit board 1A (FIGS. 2A and 2B) of the first embodiment. FIGS. 17A and 17B illustrate, as the signal line 20, a signal line 21 extending in the direction X, and a signal line 22 extending in a direction Z which is oblique with respect to the direction X. Here, although the signal line 22 is continuous with the signal line 21 in this embodiment, the signal line 22 is not necessarily continuous with the signal line 21.

As illustrated in FIG. 17A, for the signal line extending in the direction X, the slit 31a which is formed in the conductor layer 30a suppresses the skew of transmission signals, which is caused by the positional relationship between the signal line 21 and the dielectric-constant distribution of the insulation layer 10 in the direction Y orthogonal to the direction X.

The other signal line 22 extends in the oblique direction Z, and thus the positional relationship between the signal line 22 and the dielectric-constant distribution of the insulation layer 10 is not fixed. As a result, the influence to the skew caused by the positional relationship becomes smaller, compared to the case of the signal line 21. For this reason, no slit is formed in the conductor layer 30a in a position corresponding to the signal line 22, as illustrated in FIG. 17A.

The structure as illustrated in FIG. 17A reduces the area of the opening in the conductor layer 30a, and causes the conductor layer 30a to suppress the electromagnetic interference, which is caused by transmission signals transmitted along the signal line 20.

Alternatively, as illustrated in FIG. 17B, the slit 31a may be formed in the conductor layer 30a in a position corresponding to the signal line 22.

The structure as illustrated in FIG. 17B reduces the area of the conductor layer 30a, and thus reduces the cost of the material.

Here, although the description has been made for the conductor layer 30a of the circuit board 1A, the same holds true in the conductor layer 30b formed opposite to the conductor layer 30a. In this case, the slit 31b may be formed in a position corresponding to the signal line 20, with a shape similar to the shape illustrated in FIGS. 17A and 17B, respectively.

In addition, although the above-described method has been described for the circuit board 1A of the first embodiment, as an example, it may also be applied to other circuit boards of the second to the sixth embodiments, when the signal line 20 includes the signal line 22, as illustrated in FIGS. 17A and 17B. Furthermore, the connection lines 32, as described in the seventh embodiment, may be formed in the conductor layer 30a having the slit 31a to which the above-described method has been applied, or may be formed in the conductor layer 30b having the slit 31b to which the above-described method has been applied.

Next, a ninth embodiment will be described.

Figure 18:
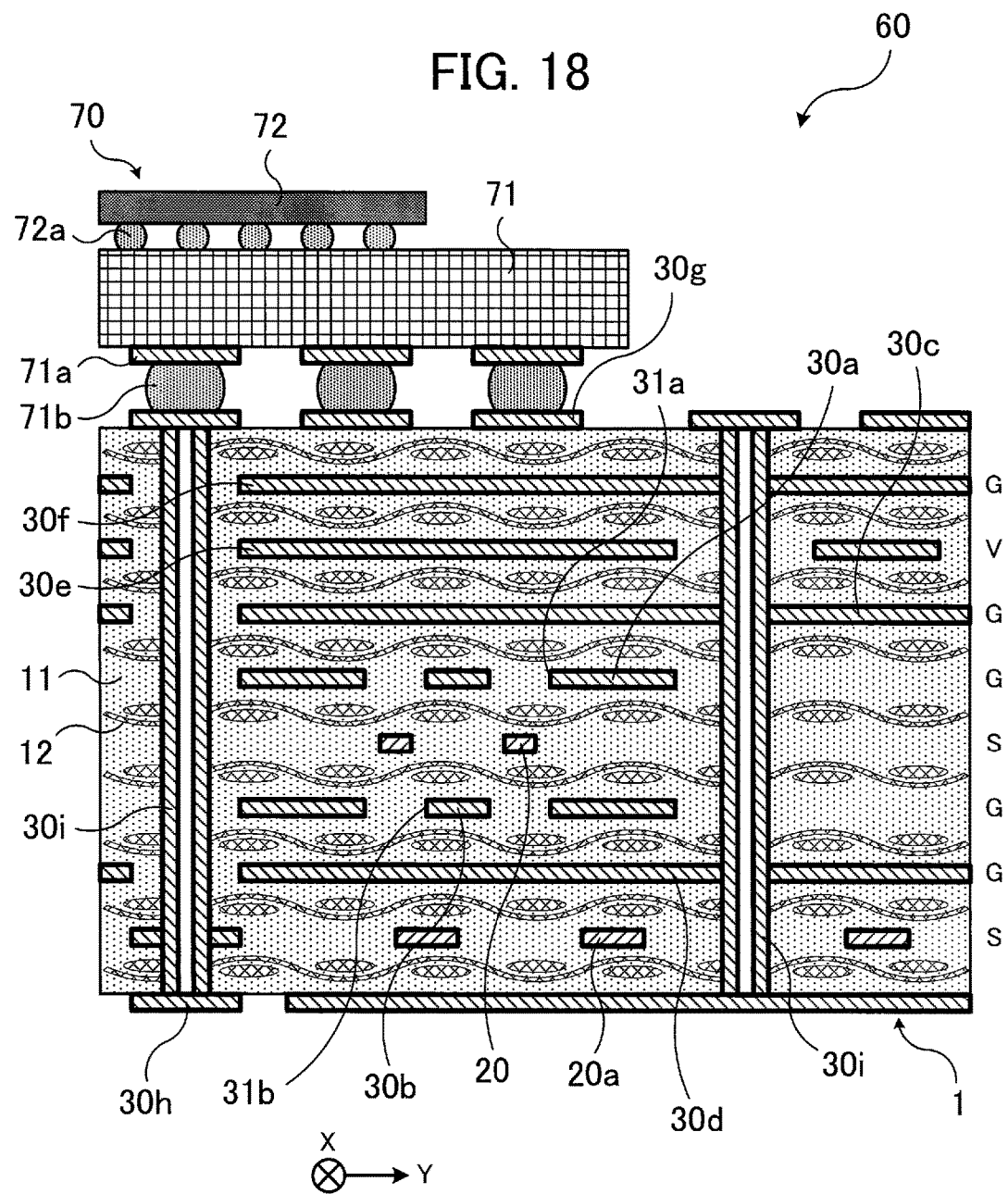
FIG. 18 illustrates one example of an electronic device of a ninth embodiment.

FIG. 18 illustrates one example of an electronic device of the ninth embodiment. FIG. 18 schematically illustrates a cross section of a principal part of one example of the electronic device of the ninth embodiment.

An electronic device 60 illustrated in FIG. 18 includes a circuit board 1, and an electronic component 70 mounted on the circuit board 1.

FIG. 18 illustrates the circuit board 1 as one example, which includes the structure of the circuit board 1C of the third embodiment (or the circuit board 1A of the first embodiment).

The circuit board 1 includes, as conductive parts, the signal line 20 (S: Signal) used for high speed signals, the conductor layers 30a and 30b (G: Ground) which have the ground potential and the slits 31a and 31b, and the conductor layers 30c and 30d (G: Ground) which have the ground potential and an electromagnetic shield function. On the upper side of the conductor layer 30c of the circuit board 1, the circuit board 1 includes, as conductive parts, a conductor layer 30e (V: Voltage) which has a power supply potential, a conductor layer 30f (G: Ground) which has the ground potential, and a conductor layer 30g which serves as top surface lines. On the lower side of the conductor layer 30d of the circuit board 1, the circuit board 1 includes, as conductive parts, a signal line 20a (S: Signal) used for signals other than the high speed signals, and a conductor layer 30h (G: Ground) which serves as bottom surface lines.

Of these conductive parts, the signal lines 20 and 20a, and the conductor layers 30a, 30b, 30c, 30d, 30e, and 30f are formed in the insulation layer 10 containing the resin 11 and the glass cloth 12; the conductor layer 30g is formed on the top surface of the insulation layer 10; and the conductor layer 30h is formed on the bottom surface of the insulation layer 10.

The insulation layer 10 is provided with a through-via (through-hole via) 30i which passes through the insulation layer 10 from the top surface to the bottom surface of the insulation layer 10. For example, the through-via 30i is electrically connected to the conductor layers 30c, 30d, 30f, 30g, and 30h, which have the ground potential. Alternatively, the through-via 30i is electrically connected to the signal line 20a, and the conductor layers 30g and 30h which are used for signals.

Here, the electronic component 70 mounted on the circuit board 1 is illustrated as a semiconductor package (semiconductor device). The semiconductor package includes a package board (circuit board) 71, and a semiconductor chip (semiconductor element) 72, such as a large scale integration (LSI), mounted on the package board 71. The semiconductor chip 72 is electrically connected to the package board 71 via terminals 72a, such as solder bumps. Terminals 71b, such as solder bumps, formed on electrodes 71a are joined with the conductor layer 30g, such that the package board 71 is electrically connected to the circuit board 1.

In the electronic device 60 having such a structure, the slits 31a and 31b are respectively formed in the conductor layers 30a and 30b of the circuit board 1, at positions corresponding to the signal line 20. Here, the conductor layers 30a and 30b constitute a pair, and the signal line 20 is interposed between the conductor layers 30a and 30b. The slits 31a and 31b expand the electric field produced between the signal line 20 and the conductor layer 30a, and between the signal line 20 and the conductor layer 30b; cause less difference in the dielectric constant in the vicinity of the signal line 20 (the difference is caused by the positional relationship between the signal line 20 and the dielectric-constant distribution); and suppress the skew of transmission signals.

Because the skew is suppressed in this manner, the electronic component 70 and other electronic components (not illustrated) mounted on the circuit board 1, to/from which signals are transmitted through the signal line 20, are able to operate without any malfunction caused by the delay of signals (the difference in arrival time). Thus, the use of the circuit board 1 will achieve the electronic device 60 having high performance.

In addition, the use of a circuit board which includes any structure of the circuit boards 1B and 1D to 1G described in the second and the fourth to the eighth embodiments will also achieve a high-performance electronic device.

Here, the semiconductor package which includes the package board 71 and the semiconductor chip 72 mounted on the package board 71 has been described, as an example of the electronic component 70. However, the semiconductor package is not limited to the one illustrated in FIG. 18. Thus, any of various semiconductor packages may be mounted on the circuit board 1, as the electronic component 70. The semiconductor package may have a pseudo SOC (system on a chip) structure, or a POP (package on package) structure. Instead of the semiconductor package, various semiconductor chips, such as one or more semiconductor chips and a three-dimensional stacked chip, may be mounted on the circuit board 1, as the electronic component 70.

The circuit board 1 may be formed by using the following method, for example.

FIGS. 19A to 19E illustrate one example of a method of forming the circuit board of the ninth embodiment. FIGS. 19A to 19E each schematically illustrate a cross section of a principal part of each process of the method of forming the circuit board of the ninth embodiment.

Figure 19A:
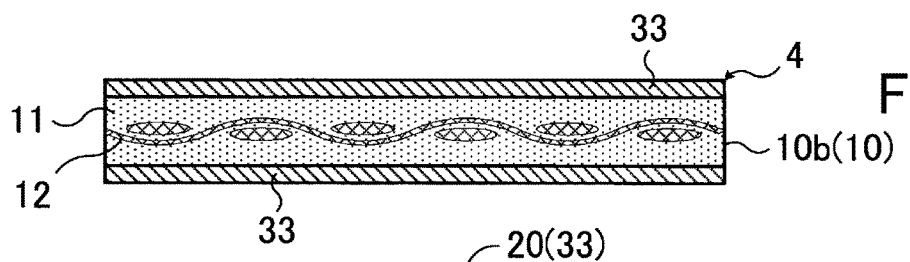
FIGS. 19A to 19E illustrate one example of a method of forming the circuit board of the ninth embodiment.

First, conductive foils 33 are laminated on both surfaces of the insulation layer 10b (insulation layer 10) containing the resin 11 and the glass cloth 12 to form a board 4, as illustrated in FIG. 19A. The board 4 is, for example, a double-sided copper-clad board whose both surfaces are laminated with copper foils as conductive foils 33.

Figure 19B:
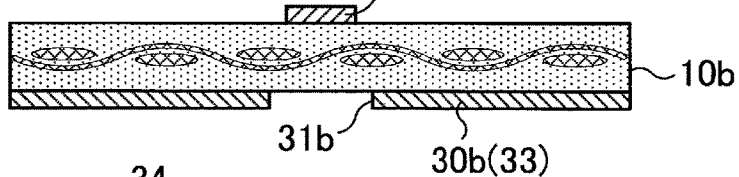

Then, patterning is performed on the conductive foils 33 on both sides of the board 4 by using photolithography and etching, so that the signal line 20 having a predetermined width, and the conductor layer 30b having the slit 31b with a predetermined width is formed, as illustrated in FIG. 19B.

Figure 19C:
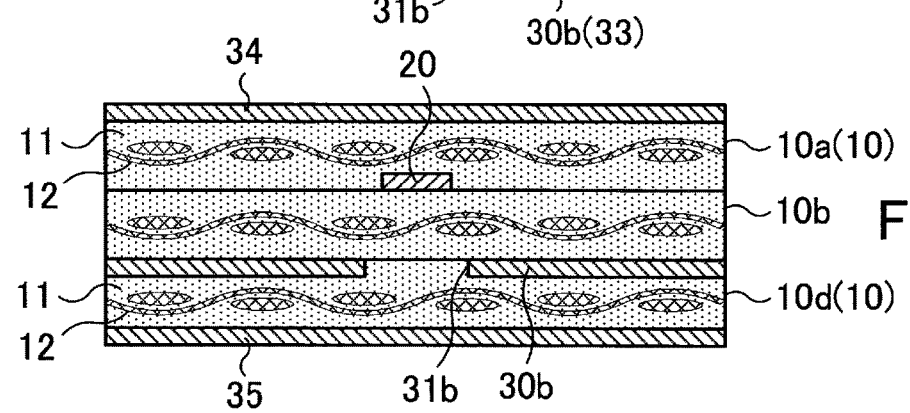

Then, as illustrated in FIG. 19C, the surface of the insulation layer 10b on which the signal line 20 is formed is laminated with the insulation layer 10a (insulation layer 10) containing the resin 11 and the glass cloth 12, and then with a conductive foil 34, such as a copper foil. Similarly, the surface of the insulation layer 10b on which the conductor layer 30b is formed is laminated with the insulation layer 10d (insulation layer 10) containing the resin 11 and the glass cloth 12, and then with a conductive foil 35, such as a copper foil. The lamination of the insulation layer 10a and the conductive foil 34 and the lamination of the insulation layer 10d and the conductive foil 35 may be performed separately or simultaneously. For example, the lamination is performed while heating and pressurization are performed by using a vacuum laminator.

Figure 19D:
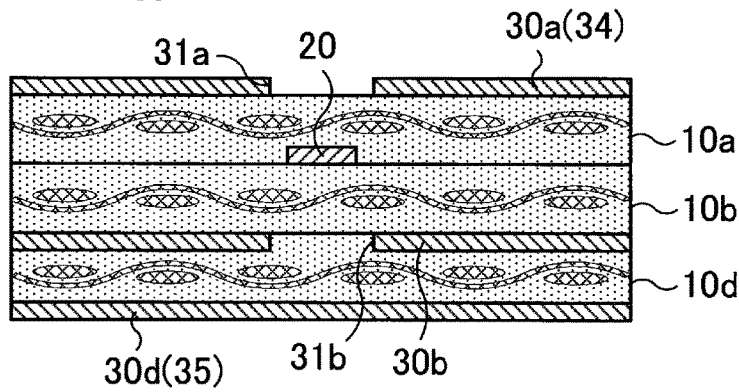

Then, as illustrated in FIG. 19D, patterning is performed on the conductive foil 34 by using photolithography and etching, so that the conductor layer 30a having the slit 31a with a predetermined width is formed. Similarly, patterning is performed on the conductive foil 35 by using photolithography and etching, so that the conductor layer 30d is formed. The formation of the conductor layer 30a and the formation of the conductor layer 30d may be performed separately or simultaneously.

Figure 19E:
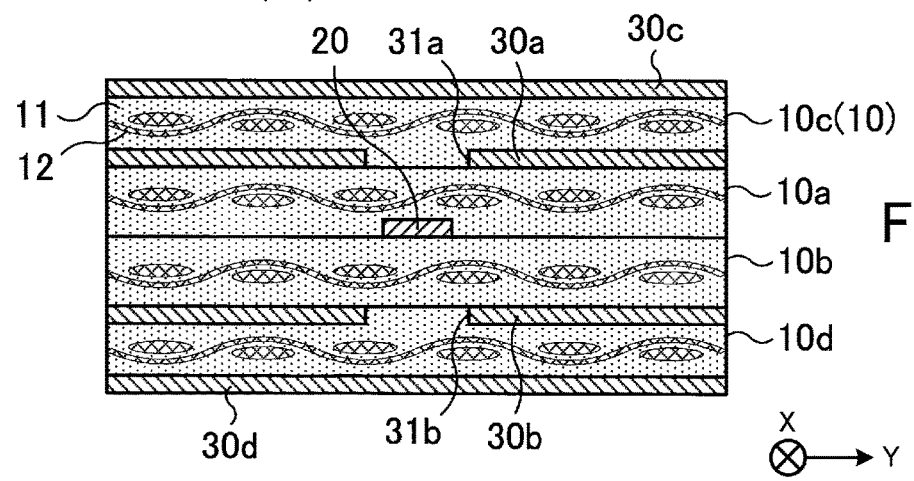

After that, the lamination of an insulation layer and a conductive foil, and the formation of a conductor layer performed through the patterning of the conductive foil may be repeated for the predetermined number of layers, in accordance with the processes of FIGS. 19C and 19D. For example, as illustrated in FIG. 19E, the surface of the insulation layer 10a on which the conductor layer 30a is formed is laminated with the insulation layer 10c (insulation layer 10) containing the resin 11 and the glass cloth 12, and then with a conductive foil, such as a copper foil; then, patterning is performed on the conductive foil to form the conductor layer 30c. Such processes are repeated for the predetermined number of upper and lower layers to obtain the circuit board 1 as illustrated in FIG. 18.

The process of FIG. 19A and the process of FIG. 19B produce the circuit board 1B of the second embodiment.

Of the processes of FIGS. 19C and 19D, the lamination of the insulation layer 10a and the conductive foil 34 (FIG. 19C), and the formation of the conductor layer 30a performed through the patterning of the conductive foil 34 (FIG. 19D) produce the circuit board 1A of the first embodiment. If the glass cloth used for the insulation layer 10a differs from the glass cloth used for the insulation layer 10b, the circuit boards 1S and 1F of the fifth embodiment are produced.

Of the processes of FIGS. 19C and 19D, the lamination of the insulation layer 10d and the conductive foil 35 (FIG. 19C), and the formation of the conductor layer 30d performed through the patterning of the conductive foil 35 (FIG. 19D) produce the circuit board 1D of the fourth embodiment.

The process of FIG. 19A through the process of FIG. 19E produce the circuit board 10 of the third embodiment. If the glass cloth used for the insulation layer 10a differs from the glass cloth used for the insulation layer 10b, the circuit board 1G of the sixth embodiment is produced.

When the patterning of the conductive foils 33 and 34 is performed as appropriate, the connection lines 32 of the seventh embodiment and the signal lines 21 and 22 of the eighth embodiment are produced.

The circuit boards 1A to 1G of the first to the ninth embodiments, and the electronic device 60 that includes any of the circuit boards may be used for a variety of electronic apparatuses (referred to also as electronic devices). Examples of the electronic apparatuses include computers (personal computers, supercomputers, servers, etc.), smartphones, mobile phones, tablet terminals, sensors, cameras, audio devices, measuring instruments, inspection devices, and manufacturing devices.

FIG. 20 illustrates one example of the electronic apparatus. FIG. 20 schematically illustrates one example of the electronic apparatus.

As illustrated in FIG. 20, the electronic device 60 as illustrated in FIG. 18 is mounted on (incorporated in) an electronic apparatus 80, which may be any of the electronic apparatuses previously described as examples. In the circuit board 1 used for the electronic device 60, the slits 31a and 31b expand the electric field produced between the signal line 20 and the conductor layer 30a, and between the signal line 20 and the conductor layer 30b; cause less difference in the dielectric constants in the vicinity of the signal line 20

(the difference is caused by the positional relationship between the signal line 20 and the dielectric-constant distribution); and suppress the skew of transmission signals. In addition, the conductor layers 30c and 30d having an electromagnetic shield function suppress the electromagnetic interference caused by transmission signals transmitted along the signal line 20. This configuration will achieve the high-performance electronic device 60 and the high-performance electronic apparatus 80 having the electronic device 60.

By the way, flexible boards are known as one form of the circuit board. Such a circuit board having flexibility does not contain a material, such as glass cloth, which significantly increases stiffness. Thus, problems concerning the dielectric-constant distribution of the insulation layer due to the glass cloth as described above and the skew due to the dielectric-constant distribution do not occur in the flexible board. In addition, also in circuit boards which are called silicon interposer or glass interposer, the problems concerning the above-described dielectric-constant distribution and skew do not occur.

In the foregoing description, the circuit boards 1A to 1G of the first to the ninth embodiments, the electronic device 60, and the electronic apparatus 80 have been described.

The disclosed technique achieves a circuit board which reduces difference in signal transmission speeds, caused by the positional relationship between the signal line and the dielectric-constant distribution of the insulation layer. In addition, the disclosed technique achieves a high-performance electronic device which includes such a circuit board.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A circuit board comprising:
   a first insulation layer;
   a signal line formed over the first insulation layer and extending in a first direction; and
   a first conductor layer formed under the first insulation layer,
   wherein the first insulation layer has periodic dielectric-constant distribution in a second direction orthogonal to the first direction, and
   wherein the first conductor layer includes a first opening overlapped with at least a first part of the signal line, in a planar view.

2. The circuit board according to claim 1, wherein the first insulation layer includes a first resin, and a first glass cloth formed in the first resin.

3. The circuit board according to claim 1, wherein a width of the first opening in the second direction is larger than a width of the signal line in the second direction.

4. The circuit board according to claim 1, further comprising:
   a second insulation layer formed under the first insulation layer and the first conductor layer; and
   a second conductor layer formed under the second insulation layer and facing the first opening and the first conductor layer.

5. The circuit board according to claim 1, wherein the first conductor layer includes a second opening overlapped with a second part of the signal line different from the first part, in the planar view.

6. The circuit board according to claim 1, further comprising:
   a third insulation layer formed over the first insulation layer and the signal line; and
   a third conductor layer formed over the third insulation layer,
   wherein the third insulation layer has periodic dielectric-constant distribution in the second direction.

7. The circuit board according to claim 6, wherein the first insulation layer includes a first resin, and a first glass cloth formed in the first resin, and
   wherein the third insulation layer includes a second resin, and a second glass cloth formed in the second resin.

8. The circuit board according to claim 7, wherein a glass yarn pitch of the second glass cloth differs from a glass yarn pitch of the first glass cloth.

9. The circuit board according to claim 6, wherein the third conductor layer includes a third opening overlapped with at least a third part of the signal line, in the planar view.

10. The circuit board according to claim 9, wherein a width of the third opening in the second direction is larger than a width of the signal line in the second direction.

11. The circuit board according to claim 9, wherein a width of the third opening in the second direction differs from a width of the first opening in the second direction.

12. The circuit board according to claim 11, wherein the first insulation layer includes a first resin, and a first glass cloth formed in the first resin,
    wherein the third insulation layer includes a second resin, and a second glass cloth formed in the second resin, and
    wherein a ratio of the width of the third opening in the second direction to the width of the first opening in the second direction is equal to a ratio of a glass yarn pitch of the second glass cloth to a glass yarn pitch of the first glass cloth.

13. The circuit board according to claim 9, further comprising:
    a second insulation layer formed under the first insulation layer and the first conductor layer;
    a second conductor layer formed under the second insulation layer and facing the first opening and the first conductor layer;
    a fourth insulation layer formed over the third insulation layer and the third conductor layer; and
    a fourth conductor layer formed over the fourth insulation layer and facing the third opening and the third conductor layer.

14. The circuit board according to claim 9, wherein a sum of a width of the first opening in the second direction and a width of the signal line in the second direction is larger than one cycle of the dielectric-constant distribution of the first insulation layer in the second direction, and
    wherein a sum of a width of the third opening in the second direction and the width of the signal line in the second direction is larger than one cycle of the dielectric-constant distribution of the third insulation layer in the second direction.

15. The circuit board according to claim 9, wherein the third conductor layer includes a fourth opening overlapped with a fourth part of the signal line different from the third part, in the planar view.

16. An electronic device comprising:
a circuit board; and
an electronic component mounted on the circuit board,
the circuit board including:
a first insulation layer;
a signal line formed over the first insulation layer and extending in a first direction; and
a first conductor layer formed under the first insulation layer,
wherein the first insulation layer has periodic dielectric-constant distribution in a second direction orthogonal to the first direction, and
wherein the first conductor layer includes a first opening overlapped with at least a first part of the signal line, in a planar view.

17. The electronic device according to claim 16, wherein the circuit board further includes:
a second insulation layer formed over the first insulation layer and the signal line; and
a second conductor layer formed over the second insulation layer,
wherein the second insulation layer has periodic dielectric-constant distribution in the second direction, and
wherein the second conductor layer includes a second opening overlapped with at least a second part of the signal line, in the planar view.

* * * * *